(12) United States Patent
Takayama et al.

(10) Patent No.: US 7,341,924 B2
(45) Date of Patent: Mar. 11, 2008

(54) METHOD FOR MANUFACTURING SEMICONDUCTOR DEVICE

(75) Inventors: Toru Takayama, Atsugi (JP); Yasuyuki Arai, Atsugi (JP); Yukie Suzuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/452,987

(22) Filed: Jun. 15, 2006

(65) Prior Publication Data

US 2006/0231527 A1 Oct. 19, 2006

Related U.S. Application Data

(62) Division of application No. 11/007,308, filed on Dec. 9, 2004, now Pat. No. 7,084,045.

(30) Foreign Application Priority Data

Dec. 12, 2003 (JP) .............................. 2003-414879

(51) Int. Cl.
*H01L 21/30* (2006.01)
*H01L 21/46* (2006.01)
(52) U.S. Cl. ...................... 438/455; 438/456; 438/457; 438/458
(58) Field of Classification Search ...................... None
See application file for complete search history.

(56) References Cited

U.S. PATENT DOCUMENTS

| | | | |
|---|---|---|---|
| 4,409,134 A | 10/1983 | Yamazaki | |
| 5,834,327 A | 11/1998 | Yamazaki et al. | |
| 6,100,166 A | 8/2000 | Sakaguchi et al. | |
| 6,127,199 A | 10/2000 | Inoue et al. | |
| 6,335,479 B1 | 1/2002 | Yamada et al. | |
| 6,372,608 B1 | 4/2002 | Shimoda et al. | |
| 6,521,511 B1 * | 2/2003 | Inoue et al. | 438/458 |
| 6,645,830 B2 | 11/2003 | Shimoda et al. | |
| 6,867,067 B2 | 3/2005 | Ghyselen et al. | |
| 7,169,652 B2 * | 1/2007 | Kimura | 438/149 |

(Continued)

FOREIGN PATENT DOCUMENTS

JP 10-125929 5/1998

(Continued)

*Primary Examiner*—Duy-Vu N Deo
(74) *Attorney, Agent, or Firm*—Eric J. Robinson; Robinson Intellectual Property Law Office, P.C.

(57) ABSTRACT

A method of separating a lamination body with high yield without damaging the lamination body is provided. Further, a method of manufacturing a lightweight, flexible semiconductor device, which is thin in total is provided. The method of manufacturing the semiconductor device includes: a first step of laminating a metal layer, an oxide layer, a layer containing no hydrogen element, and a lamination body on a first substrate; a second step of forming a photocatalytic layer on a transparent substrate; and a third step of attaching the photocatalytic layer to the surface of the lamination body by using a first adhesive material after the first and second steps, separating the metal layer from the oxide layer, and irradiating light from a side of the transparent substrate so that an interface between the photocatalytic layer and the first adhesive material is separated to remove the first adhesive material.

45 Claims, 19 Drawing Sheets

U.S. PATENT DOCUMENTS

| | | |
|---|---|---|
| 2002/0146893 A1 | 10/2002 | Shimoda et al. |
| 2003/0003687 A1 | 1/2003 | Yanagita et al. |
| 2003/0024635 A1* | 2/2003 | Utsunomiya ............. 156/272.2 |
| 2003/0087073 A1 | 5/2003 | Kobayashi |
| 2003/0217805 A1 | 11/2003 | Takayama et al. |
| 2003/0224582 A1 | 12/2003 | Shimoda et al. |
| 2004/0129960 A1 | 7/2004 | Maruyama et al. |
| 2004/0219762 A1 | 11/2004 | Shimoda et al. |

FOREIGN PATENT DOCUMENTS

| | | |
|---|---|---|
| JP | 10-125931 | 5/1998 |
| JP | 2004-214281 | 7/2004 |

* cited by examiner

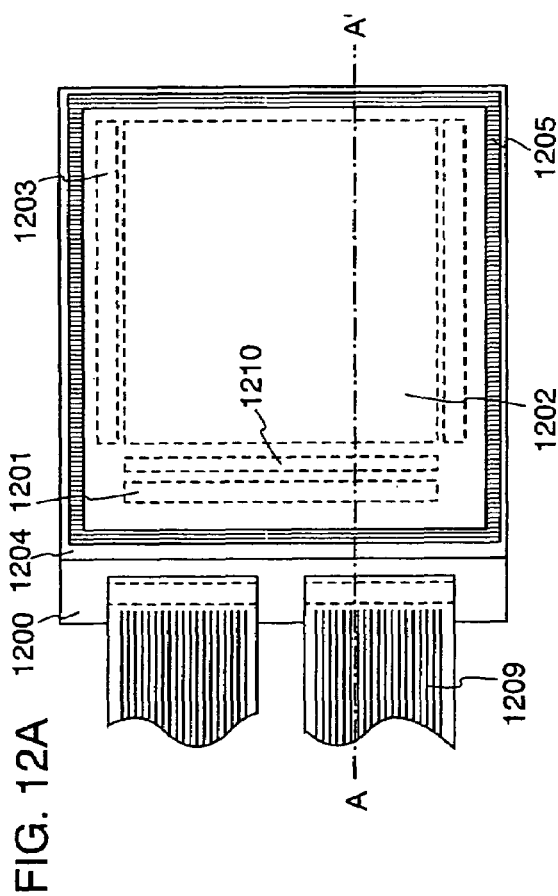
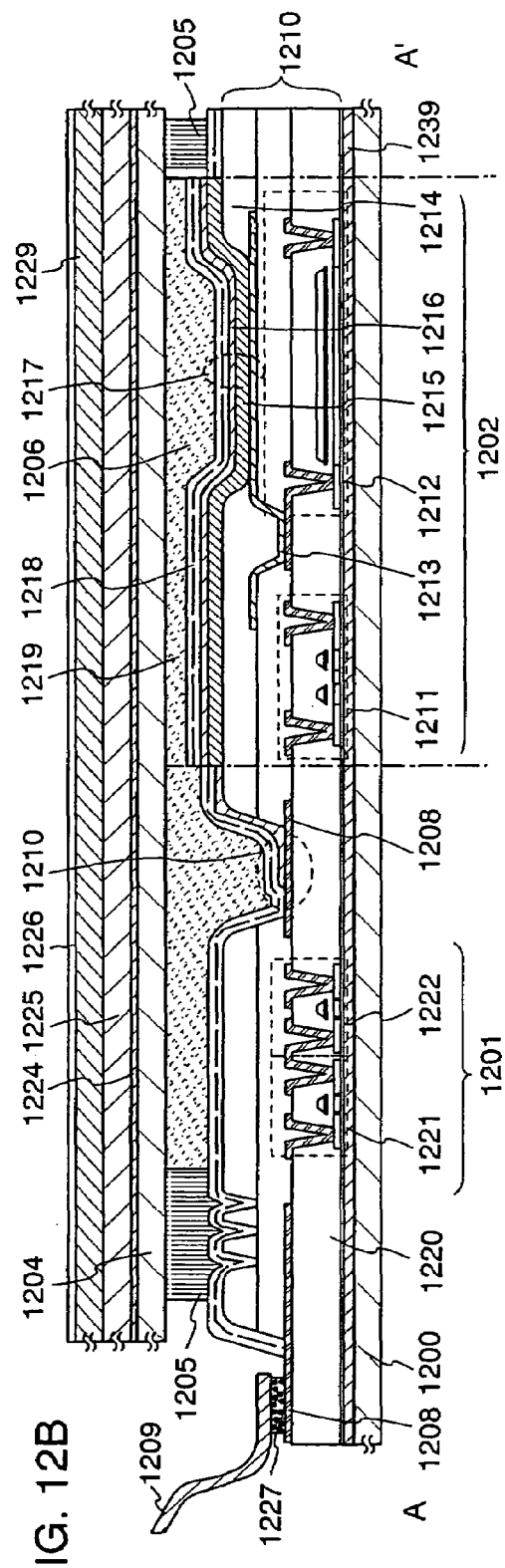
FIG. 12A
FIG. 12B

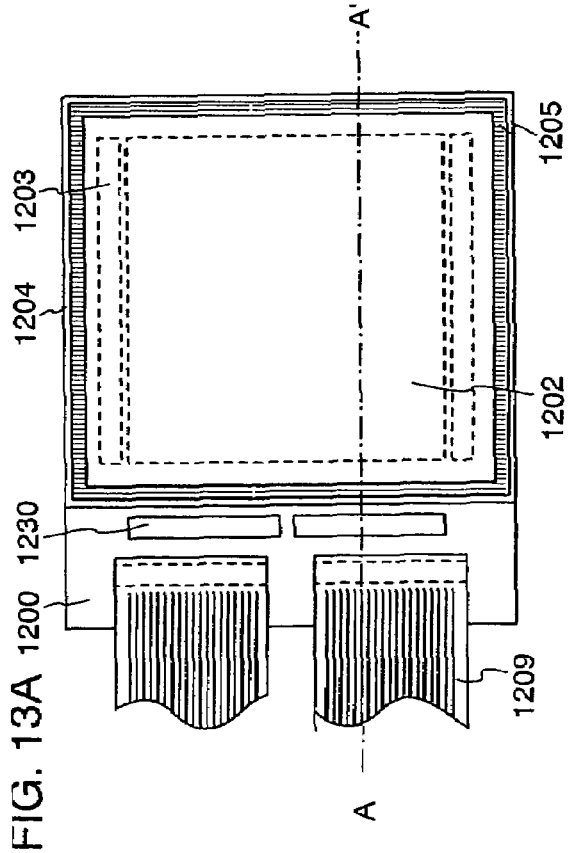
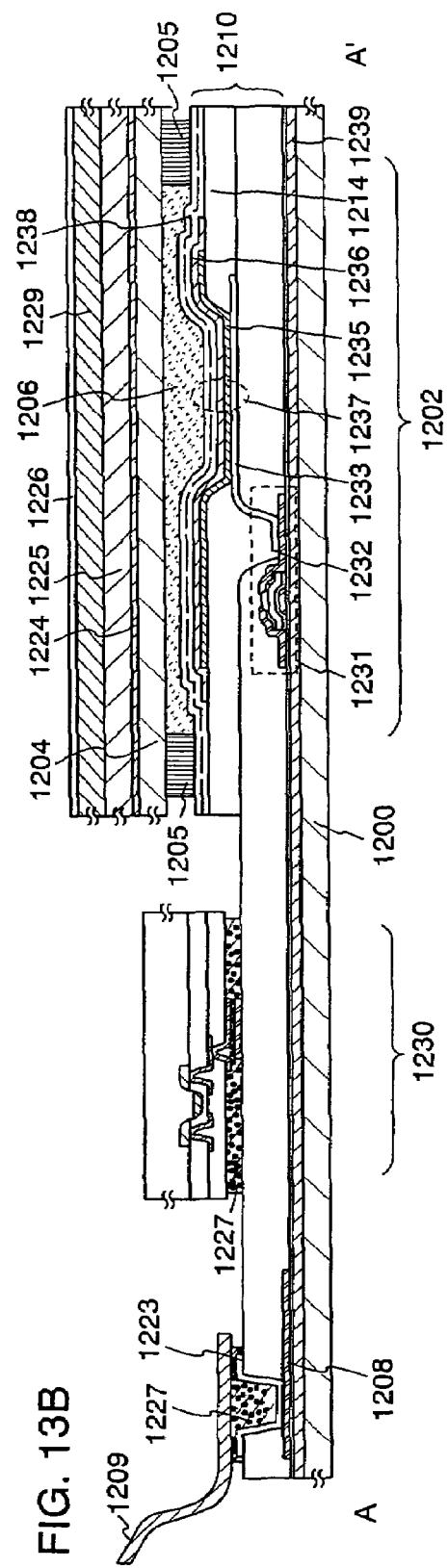
FIG. 13A
FIG. 13B

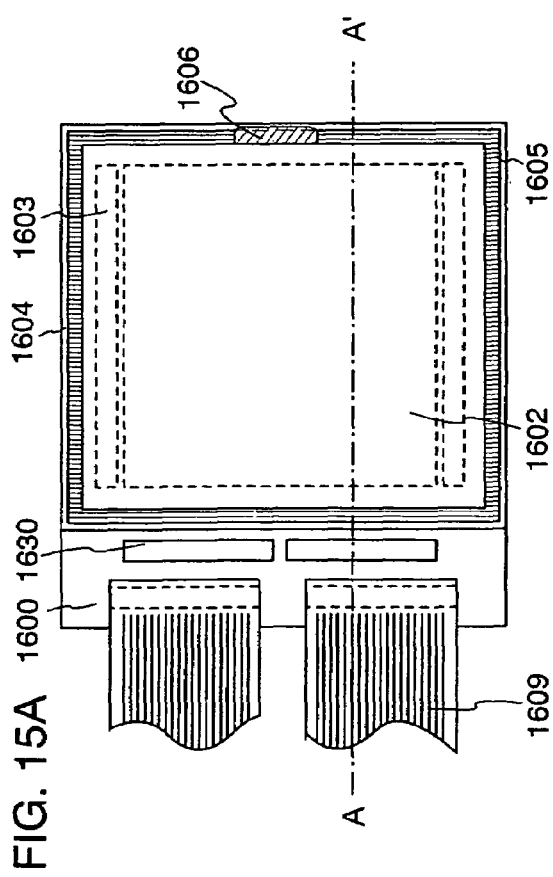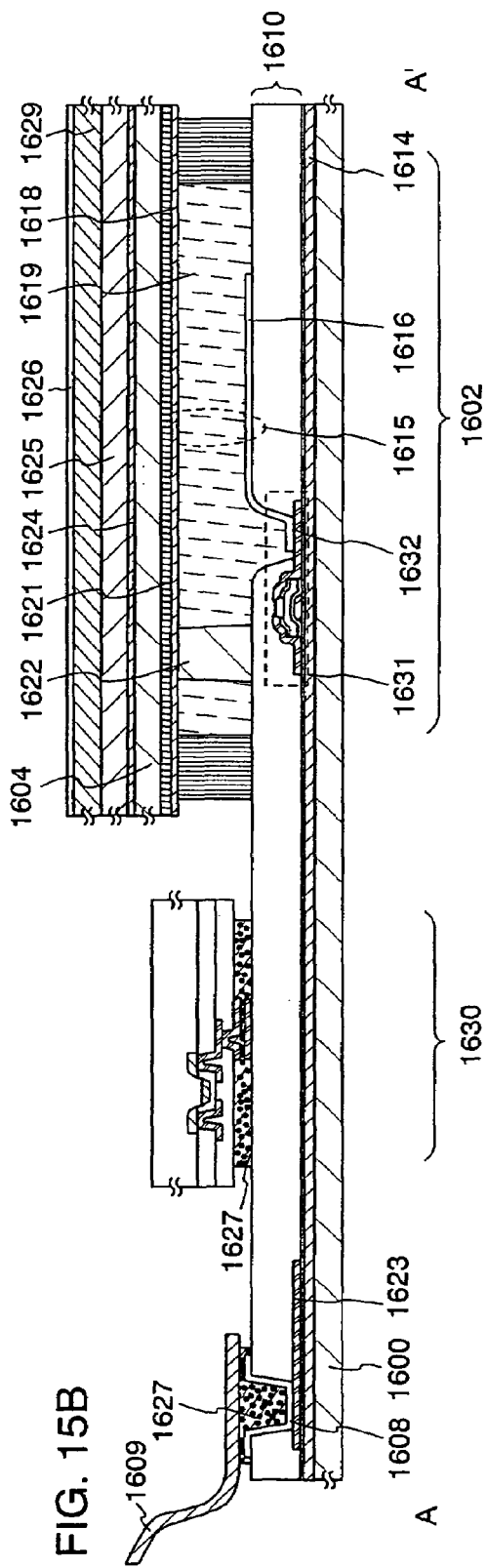

METHOD FOR MANUFACTURING SEMICONDUCTOR DEVICE

BACKGROUND OF THE INVENTION

1. Field of the Invention

The present invention relates to a method of separating (or peeling) a lamination body and a method of manufacturing a semiconductor device formed using a plastic substrate.

2. Description of the Related Art

In recent years, a technique of forming a thin film transistor (TFT) using a semiconductor thin film (with a thickness of from approximately several nm to several hundreds nm), which is formed over a substrate with an insulated surface, has been attracting attention. The thin film transistor has been widely applied in various electronic devices such as an IC and a display device. In particular, development related to the thin film transistor as a switching element for an image display device has been carried out hurriedly.

Various applications of such an image display device have been expected, and particularly, application to a portable device has been attracting much attention. A glass substrate and a quartz substrate has been typically used for forming the image display device now, however, these substrates have some drawbacks of being fragile and heavy. Further, these substrates are unsuitable for mass-production since the surface area thereof is difficulty enlarged. Therefore, it has been tried to form a semiconductor element, e.g., a TFT on a substrate having flexibility as typified by a flexible plastic film.

In the case of using the flexible plastic substrate, however, the maximum temperature of the process should be lowered since the plastic film has low heat resistant properties. Accordingly, it has been impossible to form a semiconductor element, e.g., a TFT having as good electric characteristics as that formed over a glass substrate. Thus, a high-performance semiconductor device, e.g., a liquid crystal display device or light emitting element using a plastic film has been developed.

Various kinds of methods for separating a lamination body, which is formed over a substrate through a separation body, from the substrate have been already proposed. For example, there is a technique as disclosed in patent document 1 and patent document 2, wherein a separation layer is formed on a transparent substrate by using amorphous silicon (or polysilicon), a lamination body is formed thereon, and laser light is irradiated from a side of the substrate to discharge hydrogen contained in the amorphous silicon so that a gap is caused between the separation layer and the substrate and the substrate is separated from the lamination body.

[Patent Document 1]: Japanese Patent Application Laid-Open No. Hei 10-125929

[Patent Document 2]: Japanese Patent Application Laid-Open No. Hei 10-125931

In the above-mentioned separation method, however, a substrate having a high light-transmitting property is absolutely required. Further, a step for irradiating relatively high-energy laser beam on an entire surface of the substrate is required to apply sufficient energy such that laser beam transmits through the substrate and hydrogen contained in the amorphous silicon is discharged. This might damage the lamination body. In the case where an element is formed on the separation layer according to the above-mentioned separation method, when the element is formed by a heat treatment at high processing temperatures, hydrogen contained in the separation layer is dispersed and reduced. Accordingly, poor separation might be caused even when laser beam is irradiated to the separation layer, which results in reduced yield.

SUMMARY OF THE INVENTION

It is an object of the invention to provide a separation method with high yield without damaging a lamination body. It is another object of the invention to provide a method of manufacturing a lightweight, flexible semiconductor device that is entirely thin.

According to one aspect of the invention, there is provided a method of manufacturing a semiconductor device that includes: a first step of laminating a metal film, an oxide film, a film containing no hydrogen element, a lamination body on a first substrate; and a second step of forming a photocatalytic layer on the surface of a transparent substrate; a third step of attaching the photocatalytic layer to the surface of the lamination body by using a first adhesive material after the first and second steps, separating (or peeling) the metal film from the oxide film, and irradiating light from a side of the transparent substrate so that an interface between the photocatalytic layer and the first adhesive material is separated (or peeled).

After the third step, a fourth step for removing the first adhesive material may be performed.

Since the film containing no hydrogen element is formed on the oxide film, the oxide film is not reduced in a heat treatment, which will be carried out in a step of manufacturing a semiconductor element later, and hence, the metal film can be separated from the oxide film by a small force. The film containing no hydrogen element is hereinafter referred to as an anti-reduction film (or a film for preventing reduction).

When the film containing no hydrogen element has a conductive property, it can be formed as a connection terminal as follows: after removing the oxide film, the film containing no hydrogen element is etched in a predetermined shape to achieve the connection terminal.

Alternatively, when the film containing no hydrogen element has an insulating property, a connection terminal is formed as follows: the oxide film and the film containing no hydrogen element are etched in a predetermined shape to form a protective film while exposing a part of a conductive film that is provided in the lamination body, so as to achieve the connection terminal.

Further, after separating the metal film from the oxide film, a second substrate can be attached to a surface of the oxide film by using a second adhesive material.

The metal film is made from an element selected from titanium, aluminum, tantalum, tungsten, molybdenum, copper, chromium, neodymium, iron, nickel, cobalt, ruthenium, rhodium, palladium, osmium, and iridium; a single layer formed of an alloy material or a compound material containing the above-mentioned elements as its main constituent; or a lamination layer thereof.

The oxide film is formed by subjecting the metal film to a thermal oxidation treatment, a plasma irradiation treatment, or a treatment using a strong oxidizing solution.

The film containing no hydrogen element is a nitride of an element selected from Ti, Zr, Hf, V, Nb, Ta, Cr, Mo, Fe, Co, Mn, Ni, and Al by sputtering.

As examples for the semiconductor device according to the invention, a display device, a function circuit, and the like can be cited. Typically, a liquid crystal display device, a light emitting display device, a DMD (digital micromirror device), a PDP (plasma display panel), an FED (field emission display), an electrophoretic display device (an electronic paper), and the like can be cited as the display device. The function circuit includes a CPU (central processing unit), a DRAM (dynamic random access memory), an image processing circuit, an audio processing circuit, a driver circuit, and the like.

According to the invention, separation can be performed at high yield without damaging a lamination body. A semiconductor device having a semiconductor element can be formed on a plastic substrate. As a consequence, a lightweight, thin semiconductor display device with an excellent impact resistance property can be manufactured. In addition, a semiconductor device having a curved surface or a semiconductor device that can be varied in shape can be manufactured.

BRIEF DESCRIPTION OF THE DRAWINGS

In the accompanying drawings:

FIG. 12A is a top view and FIG. 12B is a cross sectional view explaining a semiconductor device according to the invention;

FIG. 13A is a top view and FIG. 13B is a cross sectional view explaining a semiconductor device according to the invention;

FIG. 15A is a top view and FIG. 15B is a cross sectional view explaining a semiconductor device according to the invention;

DETAILED DESCRIPTION OF THE INVENTION

Embodiment Mode 1

In the present embodiment mode, a method of separating a lamination body formed over a substrate will be described with reference to FIGS. 1A to 1E.

Figure 1A:
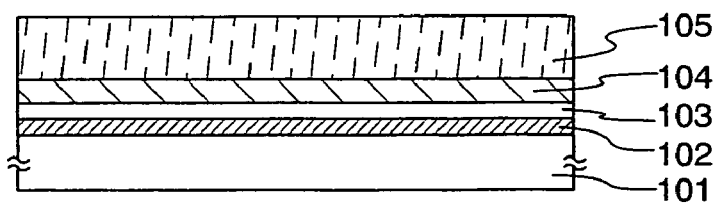
FIGS. 1A to 1E are cross sectional views explaining steps of manufacturing a semiconductor device according to the present invention.

As shown in FIG. 1A, a metal film 102 is formed on a first substrate 101. As the first substrate, a heat-resistant substrate, i.e., a material that can withstand the heat treatment in a step of manufacturing an optical filter formed later and the separation step, typically, a glass substrate, a quartz substrate, a ceramic substrate, a silicon substrate, a metal substrate, or a stainless substrate can be used.

The metal film 102 may be formed of an element selected from titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir); a single layer formed of an alloy material containing the above-mentioned elements as its main constituent; or a lamination layer thereof. Conditions of the subsequent separation step can be varied by adjusting a composition ratio of metal in alloy for the first metal film or a composition ratio of oxygen or nitrogen contained therein, properly. Therefore, the separation step can be adapted to various types of processing. The metal film 102 is formed by a known formation method such as sputtering, CVD, and vapor deposition to have a thickness of 10 to 200 nm, preferably, 50 to 75 nm.

An oxide film 103 is formed on the metal film 102. The surface of the metal film 102 is subjected to a thermal oxidation treatment, an oxygen plasma treatment, a treatment using a strong oxidizing solution such as ozone water to form the oxide film 103 with a thickness of 1 to 10 nm, preferably, 2 to 5 nm.

In the case of the separation step carried out later, separation is caused inside the oxide film or in an interface between the metal film and the oxide film.

An anti-reduction film 104 is formed on the oxide film 103. It is preferable that a film, that substantially contains no hydrogen element, be used as the anti-reduction film. Therefore, the present embodiment mode uses a film containing no hydrogen element. That is, the anti-reduction film 104 is the film containing no hydrogen element. As representative examples of the anti-reduction film, nitride of an element selected from Ti, Zr, Hf, V, Nb, Ta, Cr, Mo, Fe, Co, Mn, Ni, and Al, and the like. In the present embodiment mode, the anti-reduction film is formed by sputtering with use of a target including the above-mentioned element along with nitrogen. For example, an aluminum nitride (AlN) target is employed.

By using the anti-reduction film, it is possible to prevent reduction of the oxide film 103 in the heat treatment for a lamination body that will be performed later.

A lamination body 105 is formed on the anti-reduction film 104. The lamination body is formed by arbitrarily combining a semiconductor element (such as a thin film transistor, an organic thin film transistor, a thin-film diode photoelectric conversion element, and a resistive element), a display element (such as a liquid crystal element, a light emitting element, a pixel electrode, a micromirror array, and an electron emitter).

A photocatalytic layer 112 is formed on a surface of a transparent substrate 111. As the photocatalytic layer, titanium oxide ($TiO_x$), titanate ($MTiO_3$), tantalate ($MTaO_3$), niobate ($M_4Nb_6O_{17}$), Cds, ZnS, and the like can be cited (note that every "M" indicates a metal element). These materials are formed by sputtering, plasma CVD, vapor deposition, sol-gel, reversed phase micelle, electrophoresis, etc. so as to achieve the photocatalytic layer. As the transparent substrate 111, followings can be used: a glass substrate; a quartz substrate; a plastic substrate having a light transmitting property (e.g., polycarbonate (PC), ARTON formed of a norbornene resin with a polar radical that is manufactured by JSR Corporation, polyethylene terephthalate (PET), polyether sulfone (PES), polyethylene naphthalate (PEN), nylon, polyether ether ketone (PEEK), polysulfone (PSF), polyetherimide (PEI), polyarylate (PAR), polybutylene terephthalate (PBT), polyimide, etc.); and the like.

Figure 1B:
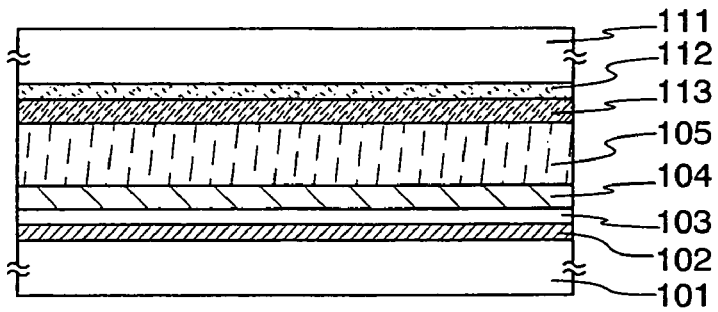

As shown in FIG. 1B, the lamination body 105 and the photocatalytic layer 112 are attached to each other by using a first adhesive material 113 formed of an organic resin. As for the first adhesive material 113, organic resins such as an epoxy resin, a silicon resin, and an acrylic resin can be exemplified. When using an oil-soluble adhesive material etc., a subsequent separation step can be easily performed. In the case where the first adhesive material is formed by application, the applied adhesive material will serves as a planarizing film. Therefore, a substrate can be attached thereto such that a surface of the substrate is approximately parallel to a surface of the planarizing film.

Preferably, a support medium is attached to the first substrate 101 by using a peelable adhesive agent to prevent breakage of each substrate. By attaching the support medium thereto, the subsequent separation step can be carried out easily by a smaller force. A substrate with higher rigidity than that of the first substrate, typically, a quartz substrate, a metal substrate, a ceramic substrate, etc. are preferably used as the support medium.

Figure 1C:
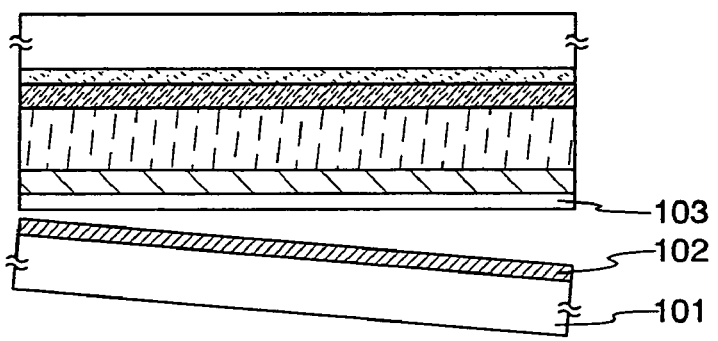

As shown in FIG. 1C, the metal film 102 is separated from the oxide film 103 by a physical means. The physical force indicates, for example, a relatively small force such as hand power, gas pressure applied through a nozzle, ultrasonic waves, and load using a wedge-shaped member.

Consequently, separation is caused inside the oxide film 103 or in an interface between the metal film 102 and the oxide film 103 so that the oxide film 103, the anti-reduction film 104, the lamination body 105, and the transparent substrate 111 attached to the lamination body can be separated from the first substrate 101 by a relatively small force.

To separate easily, a pretreatment is preferably carried out as a previous step prior to the separation step. Typically, a treatment for partly reducing the adhesiveness between the metal film 102 and the oxide film 103 is performed. The treatment for partly reducing the adhesiveness therebetween is performed by partly irradiating laser beam to the metal film 102 along a rim of a region to be separated, or performed by partly damaging inside or an interface of the metal film 102 by locally applying pressure along a rim of a region to be separated from an external portion. Specifically, a hard needle such as a diamond pen may perpendicularly be pressed and moved while applying load thereto. A scriber device is preferably used to move the hard needle while applying pressure with press force of from 0.1 to 2 mm. Accordingly, it is important to generate a portion where a separation phenomenon is easily caused, i.e., a trigger of the separation phenomenon, prior to performing the separation step. By performing the pretreatment for selectively (partly) reducing the adhesiveness in advance, poor separation can be prevented, thereby improving the yield.

Figure 1D:
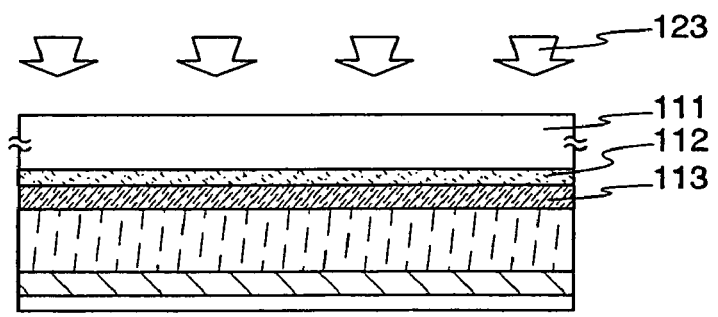

As shown in FIG. 1D, light 123 is irradiated from a side of the transparent substrate 111. The light 123, which can activate the photocatalytic layer, may be used. In the case where the photocatalytic layer is formed of TiOx, ultraviolet light may be irradiated. When the photocatalytic layer is formed of CdS, visible light may be irradiated. Irradiation of light allows the photocatalytic layer to be separated from the first adhesive material 113.

Figure 1E:
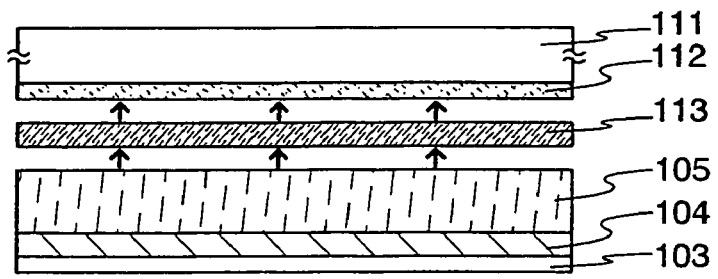

Subsequently, as shown in FIG. 1E, the transparent substrate 111 and the photocatalytic layer 112 formed thereon are removed. Also, the first adhesive material 113 may be removed.

According to the above-mentioned steps, the lamination body including a semiconductor element that is formed on the first substrate can be separated. A semiconductor device comprising a lamination body formed on the oxide film and the anti-reduction film can be manufactured. By utilizing only the oxide film and the anti-reduction film as support mediums, a thin, lightweight, flexible semiconductor device can be manufactured. Such a semiconductor device can be attached or disposed to a predetermined portion, and hence, can be applied widely.

Embodiment Mode 2

A method of manufacturing a semiconductor device using a plastic substrate as its support medium will be described in the present embodiment mode with reference to FIGS. 2A to 2E.

Figure 2A:
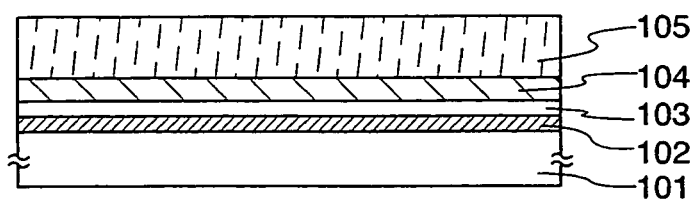
FIGS. 2A to 2E are cross sectional views explaining steps of manufacturing a semiconductor device according to the invention.
Figure 2B:
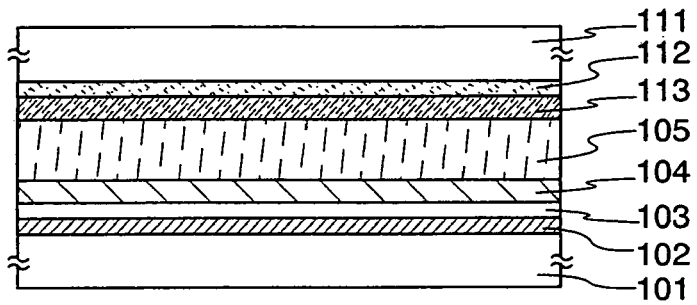
Figure 2C:
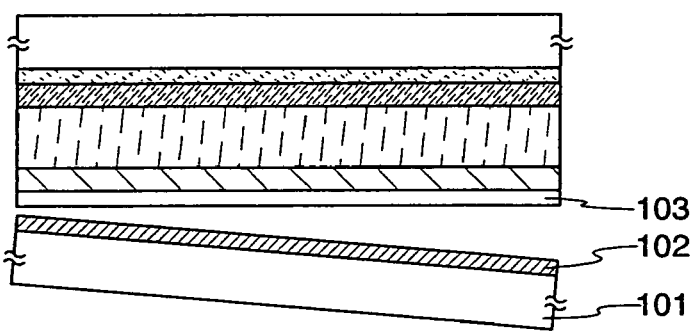

As shown in FIG. 2C, a metal film 102 is separated from an oxide film 103 in the same manner as the steps illustrated in FIGS. 1A to 1C in Embodiment Mode 1.

Figure 2D:
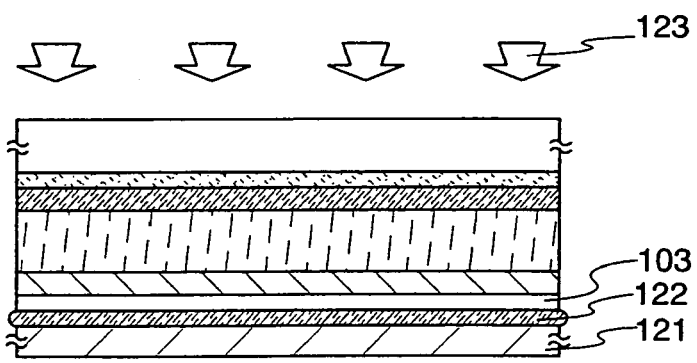

As shown in FIG. 2D, a second substrate 121 is attached to a surface of the oxide film 103, where is exposed due to the separation, by using a second adhesive material 122. As for the second adhesive material, an epoxy resin can be used. The second substrate can be made from an organic resin such as polycarbonate (PC); ARTON formed of a norbornene resin with a polar radical that is manufactured by JSR Corporation; polyethylene terephthalate (PET); polyether sulfone (PES); polyethylene naphthalate (PEN); nylon; polyether ether ketone (PEEK); polysulfone (PSF); polyetherimide (PEI); polyarylate (PAR); polybutylene terephthalate (PBT); polyimide; polypropylene; polypropylene sulfide; polyphenylene sulfide; polyphenylene oxide; polysulfone; and polyphthalamide. In addition, an HT substrate (manufactured by Nippon Steel Chemical Co., Ltd.) with a Tg (glass transition) point of 400° C. or more may be used.

Light 123 is irradiated from a side of a transparent substrate 111 as well as Embodiment Mode 1. According to the irradiation step, the photocatalytic layer 112 is separated from the first adhesive material 113.

Figure 2E:
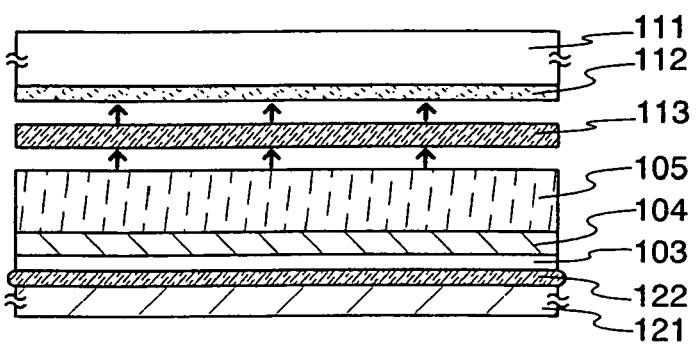

As shown in FIG. 2E, the transparent substrate 111 and the photocatalytic layer 112 formed thereon are removed. Also, the first adhesive material 113 may be removed.

According to the above-mentioned steps, it is possible to fabricate a semiconductor device including the lamination body formed on the oxide film and the anti-reduction film, wherein the oxide film and the anti-reduction film are further provided on the flexible substrate, i.e., on the plastic substrate. By using plastic as a support medium, a thin, lightweight, flexible semiconductor device can be manufactured.

Embodiment 1

In the present embodiment, a method of manufacturing a semiconductor device using Embodiment Mode 1 will be described with reference to FIGS. 3A to 3E and FIGS. 4A to 4D.

Figure 3A:
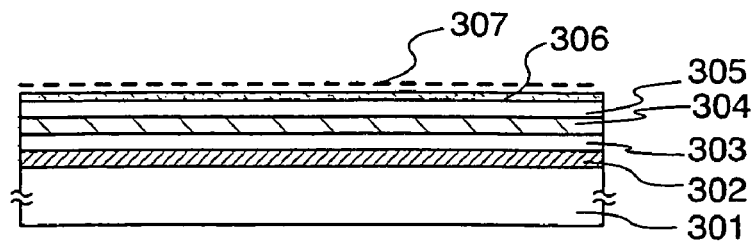
FIGS. 3A to 3E are cross sectional views explaining steps of manufacturing a semiconductor device according to the invention.

As shown in FIG. 3A, a metal film 302 (e.g., a tungsten film with a thickness of 10 to 200 nm, preferably, 30 to 75 nm) is formed on a first substrate 301. The metal film is heated to form an oxide film 303 (e.g., a tungsten oxide film) with a thickness of 1 to 10 nm, preferably, 2 to 5 nm.

Since the tungsten film and the tungsten oxide film are also formed on edge surfaces of the substrate by sputtering, they are preferably and selectively removed therefrom by $O_2$ ashing etc.

An anti-reduction film 304 is formed by sputtering. In the embodiment, an $AlN_xO_y$ film is formed by using an aluminum nitride (AlN) target under an atmosphere of containing a mixture of argon gas, nitrogen gas, and oxygen gas. A first insulating film 305, e.g., a silicon oxynitride film, is next laminated by PCVD. An amorphous silicon film 306 containing hydrogen is further laminated thereon without exposing it to the atmospheric air.

The amorphous silicon film 306 is next crystallized by a known technique (e.g., solid phase growth, laser crystallization, crystallization using a catalytic metal, and the like) so as to form a TFT using a polysilicon film as an active layer. In the present embodiment, the polysilicon film is obtained by crystallization using a catalytic metal. A solution 307 containing a metal element of 10 ppm by weight (which is, herein, a nickel acetate solution) is applied by a spinner. As substitute for the application, a method of dispersing nickel elements on an entire surface of the amorphous silicon film by sputtering may be employed. The applied nickel acetate solution 307 and the first insulating film are heated and crystallized to form a semiconductor film having a crystalline structure (that is a first polysilicon film 308 in FIG. 3B). In the embodiment, after a heat treatment for dehydrogenation is carried out (at 500° C. for one hour) to eliminate hydrogen, a heat treatment for crystallization is performed (at 500° C. for four hours) so that a silicon film with a crystalline structure is obtained.

The other crystallization methods are, for example, cited as follows, and the following methods may arbitrarily be employed. After doping a metal element, which will serve as a catalyst, to an amorphous silicon film, the doped amorphous silicon film is heated to form a polysilicon film, and the polysilicon film is irradiated with pulsed laser beam. Another method is that an amorphous silicon film is irradiated with continuous wave laser so as to achieve a polysilicon film. Still another method is that after heating an amorphous silicon film to form a polysilicon film, the resultant polysilicon film is irradiated with laser beam. Yet another method is that an amorphous silicon film is doped with a metal element, which will serve as a catalyst, and heated to obtain a polysilicon film, and laser beam is irradiated to the polysilicon film.

Since the films contacting to the oxide film 303 (i.e., the metal film 302 and the anti-reduction film 304) do not contain hydrogen, they are not reduced in the above step of heating the amorphous silicon film 306. Therefore, separation can be caused inside the tungsten oxide film or in an interface between the tungsten film and the tungsten oxide film later by applying a relatively small force (e.g., hand power, gas pressure applied through a nozzle, ultrasonic waves, load using a wedge-shaped member, etc.).

Figure 3B:
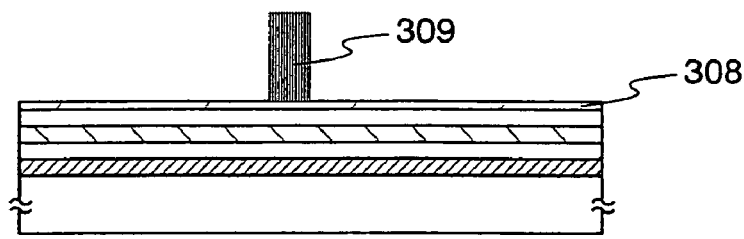

After removing an oxide film formed on a surface of the silicon film 308 with the crystalline structure by using diluted hydrofluoric acid etc., the surface thereof is irradiated with laser beam 309 (XeCl with a wavelength of 308 nm) in the atmospheric air or under an oxygen atmosphere so as to increase the degree of crystallinity and repair the defects remaining in crystal grains so that a second polysilicon film 310 is formed as shown in FIG. 3B.

Figure 3C:
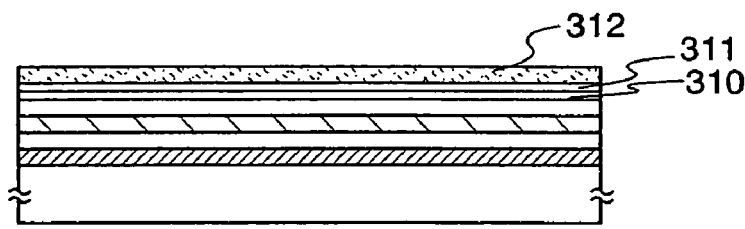

As shown in FIG. 3C, an oxide film that is formed on a surface of the second polysilicon film 310 by laser irradiation is treated with ozone water for 120 seconds to form a barrier film 311 made from an oxide film with a thickness of 1 to 5 nm in total. The barrier film 311 is formed to eliminate nickel, which has been doped for crystallization of the amorphous silicon film 306, from the polysilicon film. The oxide film formed due to irradiation of laser beam may be removed prior to forming the barrier film.

An amorphous silicon film 312 containing an argon element is next formed with a thickness of 10 to 400 nm (e.g., 100 nm in the embodiment), which will serve as a gettering site, on the barrier film 311 by sputtering or PCVD.

Subsequently, the resultant substrate is heated for 3 minutes in a furnace that is heated at 650° C. to getter nickel so that the nickel concentration contained in the semiconductor film with the crystalline structure is reduced. A rump annealing apparatus may also be used, in place of the furnace.

Figure 3D:
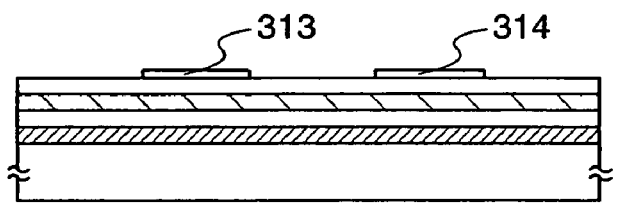

After selectively removing the amorphous silicon film 312 containing the argon element, which serves as the gettering site, by using the barrier film as an etching stopper, the barrier film is selectively removed by diluted hydrofluoric acid, as shown in FIG. 3D. Since the nickel is likely to move to a region where the oxygen concentration is high upon the gettering process, it is desirable that the barrier film made from the oxide film be removed after the gettering process.

When crystallization is carried out without using the catalytic element, the above-described steps for forming the barrier film, forming the gettering site, performing the heat treatment for gettering, removing the gettering site, removing the barrier film, etc. are not required.

A thin oxide film is formed by using ozone water on a surface of a thus obtained silicon film with the crystalline structure (also referred to as a polysilicon film). A mask made from resist is then formed on the thin oxide film. The silicon film with the crystalline structure is etched into a predetermined shape to form island-like polysilicon regions 313 and 314 by using the mask. After forming the island-like polysilicon regions, the mask made from the resist is removed.

Figure 3E:
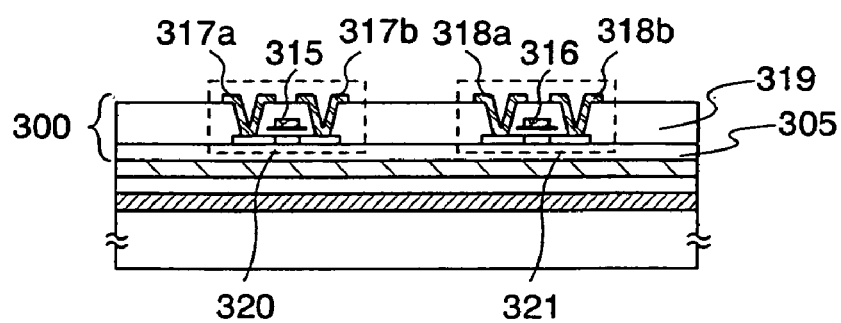

After forming a second gate insulating film 319 covering the surface of the polysilicon regions 313, 314, gate electrodes 315 and 316 are formed thereon. An impurity element is doped to each active layer to form a source region and a drain region. An interlayer insulating film (an inorganic insulating film) is formed thereon. Source electrodes and drain electrodes 317a, 317b, 318a, and 318b are formed. An activation treatment and a hydrogenation treatment are arbitrarily performed so that top-gate TFTs 320 and 321 using the polysilicon film as their active layers are fabricated (FIG. 3E). When phosphorus imparting an n-type conductivity is doped to the active layer as an impurity element, an n-channel TFT can be formed. Alternatively, when boron imparting a p-type conductivity is doped, a p-channel TFT can be formed. A CMOS circuit can be manufactured by combining the p-channel TFT and the n-channel TFT.

Note that although the embodiment exemplifies the top-gate TFTs as the structure of the TFTs, the present embodiment is not particularly limited to the structure. For instance, either inverted-stagger type TFTs or stagger type TFTs may be employed. Also, an organic semiconductor transistor, a diode, an MIM element and the like can be used as the semiconductor elements, in place of the TFTs.

Various kinds of semiconductor elements (such as a thin film diode and a resistive element) typified by the TFTs and sensor elements (typically, a pressure-sensitive fingerprint sensor using polysilicon) can be formed by utilizing the thus-obtained polysilicon regions.

A lamination body including the first insulating film and the semiconductor elements 300 is thus formed.

Next, a photocatalytic layer 332 is formed on a glass substrate (i.e., a transparent substrate 331). In the embodiment, AN100 is used as the glass substrate. A TiOx layer is formed thereon by the sol-gel technique.

Figure 4A:
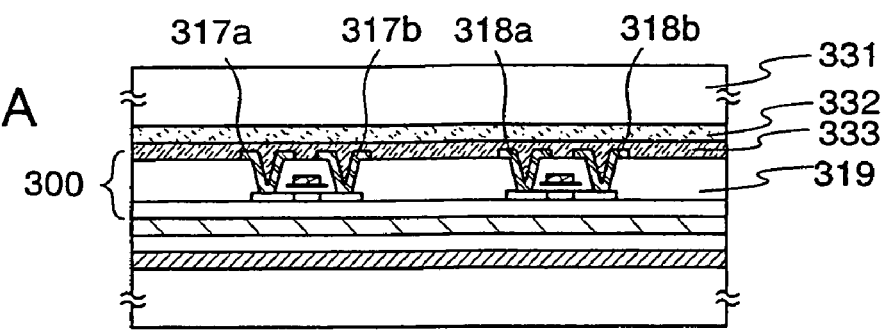
FIGS. 4A to 4D are cross sectional views explaining steps of manufacturing a semiconductor device according to the invention.

As shown in FIG. 4A, a surface of the lamination body 300 is attached to a surface of the photocatalytic layer 332 by using a first adhesive material 333. An oil-soluble adhesive material is used as the first adhesive material.

To perform the separation processing easily, a pretreatment is carried out prior to the separation step, though not shown in the drawings. A scriber device is used to move a hard needle while applying pressure with press force of from 0.1 to 2 mm so that the edge surfaces of the substrate is removed in the embodiment. Consequently, the adhesiveness between the metal film 302 and the oxide film 303 is reduced. By performing the pretreatment of selectively (partly) reducing the adhesiveness in advance, poor separation can be prevented, thereby improving the yield.

Figure 4B:
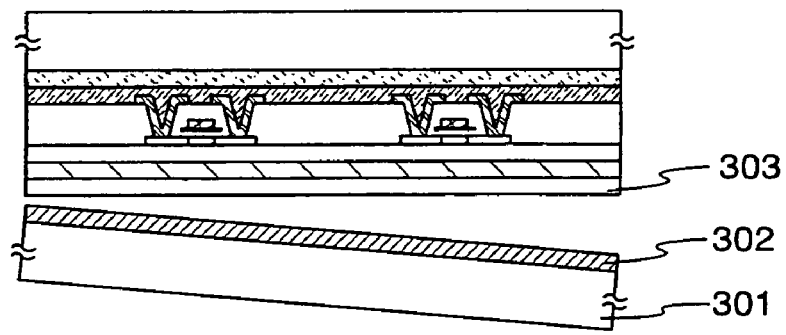

As shown in FIG. 4B, the lamination body 300 is separated from the first substrate 301. That is, separation is caused between the metal film 302 and the oxide film 303 by a physical means. The separation step can be carried out by a relatively small force (e.g., load using a member, hand power, gas pressure applied through a nozzle, ultrasonic waves, and the like). In the embodiment, a part of a member having a sharp end such as a wedge is inserted between the metal film 302 and the oxide film 303 to separate the two layers.

Figure 4C:
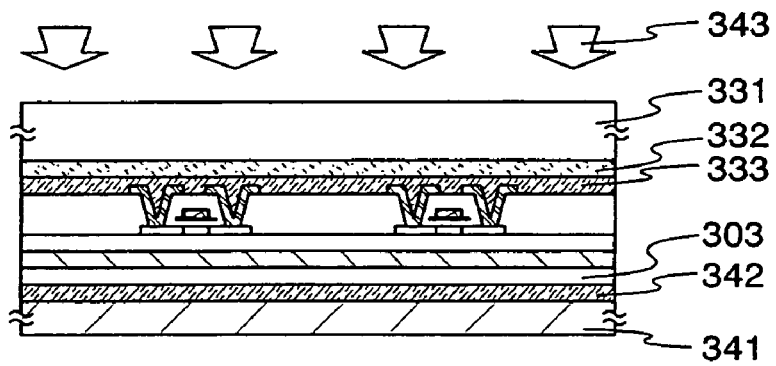

As shown in FIG. 4C, a second substrate 341 is attached to a surface of the oxide film 303 which is exposed due to the separation step by using a second adhesive material 342. An epoxy resin is used as the second adhesive material, while polycarbonate (PC) is used as the second substrate.

Figure 4D:
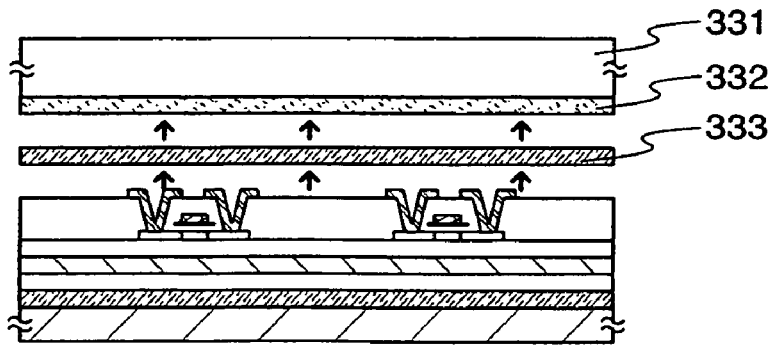

Light 343 is next irradiated from a side of the transparent substrate 331, which is the glass substrate. In this case, ultraviolet light is irradiated. By irradiating the ultraviolet light to the photocatalytic layer 332, an oxidation-reduction reaction is caused in a portion of the first adhesive material 333 in contact with the photocatalytic layer 332 and the organic resin, is decomposed so that the adhesive property of the adhesive material is reduced. Consequently, the photocatalytic layer and the glass substrate are separated from the first adhesive material 333. Afterwards, the organic resin made from the oil-soluble resin is soaked in a solvent, e.g., ether, filled in a container to be dissolved and removed (FIG. 4D).

If the adhesive material remains on the surface of the lamination body 300, defects might be caused. Therefore, the surface thereof is preferably washed by $O_2$ plasma irradiation, ultraviolet ray irradiation, ozone cleaning, etc. so as to remove the residue.

Thereafter, the substrate may be divided into respective circuit patterns, properly. In the case of dividing a glass substrate or a quartz substrate into multiple patterns by using a scriber device, a breaker device, etc., breaking and cracking are easily caused. Therefore, it has been difficult to perform a process of dividing a substrate into multiple pieces as the size of the pieces is reduced. However, the present invention uses a plastic film substrate instead of the glass substrate or the quartz substrate, and hence, the substrate can be easily divided into small-sized circuit patterns by laser processing or a cutter. Accordingly, microscopic devices can be mass-produced at high yield from a large-size substrate.

Note that although the present embodiment exemplifies the TFTs having a single drain structure, the embodiment is not particular limited thereto. A lightly doped drain (LDD) may be provided, if necessary, or multi-channel TFTs having multiple channel forming regions, e.g., double-gate TFTs may be used.

According to the invention, the lamination body can be separated at high yield without damaging the lamination body. Also, a semiconductor device having a semiconductor element can be formed on a plastic substrate. As a consequence, a lightweight, thin semiconductor device with an excellent impact resistance property can be manufactured. In addition, a semiconductor device having a curved surface or a semiconductor device that can be varied in shape can be manufactured.

Embodiment 2

The present embodiment will explain a method of manufacturing a semiconductor device having an inverted-stagger type TFT with reference to FIGS. 5A to 5D, and FIGS. 6A to 6E.

Figure 5A:
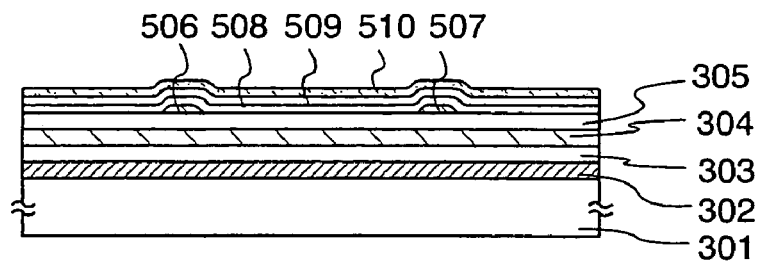
FIGS. 5A to 5D are cross sectional views explaining steps of manufacturing a semiconductor device according to the invention.

As shown in FIG. 5A, a metal film 302 with a thickness of 10 to 200 nm, preferably, 30 to 75 nm, an oxide film 303 with a thickness of 1 to 10 nm, preferably, 2 to 5 nm, an anti-reduction film 304, and a base insulating film with a thickness of 100 nm are sequentially laminated on a first substrate 301 in the same manner as Embodiment 1. In the present embodiment, a molybdenum film is formed as the metal film whereas a molybdenum oxide film is formed as the oxide film. As the anti-reduction film, a titanium nitride film having a conductive property is formed.

Subsequently, gate electrodes 506 and 507 are formed. For example, the gate electrodes may arbitrarily be formed as follows. After forming a conductive film by sputtering, vapor deposition, etc., the conductive film is etched into predetermined shapes to achieve the electrodes. Or, a solution containing conductive particles is sprayed onto predetermined regions by the droplet discharging method and dried to achieve the electrodes. As for the conductive film, a metal material such as chromium, molybdenum, titanium, tantalum, tungsten, aluminum, etc., or an alloy material thereof can be used. Since a first semiconductor film, a wiring film, and the like are formed on the gate electrodes, edges of the electrodes are desirably processed to have tapered shapes. When the gate electrodes 506 and 507 are made from an aluminum-based material, each surface thereof is preferably subjected to anodizing after etching so as to insulate the respective surfaces. Note that a wiring for connecting to the gate electrodes can simultaneously be formed in the step, though not shown in the drawings.

A second insulating film 508, a first semiconductor film 509, and a second semiconductor film 510 are next formed. By forming the second insulating film 508 on the gate electrodes 506 and 507, the second insulating film 508 can serve as a gate insulating film. In this case, the second insulating film 508 is preferably formed by laminating a silicon oxide film and a silicon nitride film. These insulating films can be formed by glow discharge decomposition or sputtering. In particular, in the case of forming dense insulating films with low gate leakage current at a low temperature, it is preferable that a reactive gas containing a rare gas element such as argon be mixed into the insulating films.

The first semiconductor film 509 is made from a film containing a semiconductor with an intermediate structure between an amorphous structure and a crystal structure (including a single crystal structure and a polycrystalline structure). The semiconductor includes a third condition that is stable in terms of free energy and a crystalline region having short-range order along with lattice distortion. That is, the semiconductor includes a Raman peak at the wavenumbers lower than 520 cm$^{-1}$ according to the measurement of Raman spectrum. The average size of crystal grains is from 0.5 to 40 nm, and the crystal grains are dispersed in an amorphous semiconductor film. Further, the semiconductor is added with hydrogen or halogen of at least 1 atomic % or more as a neutralizing agent for dangling bonds. Such semiconductor having the above-described properties is referred to as a semiamorphous semiconductor (SAS). The SAS includes a so-called microcrystalline semiconductor. By adding a rare gas element such as helium, argon, krypton, and neon to the SAS so as to promote the lattice distortion, the more stable, preferable SAS can be obtained. Such SAS is, for example, disclosed in U.S. Pat. No. 4,409,134.

The SAS can be formed by glow discharge decomposition with silicide gas. As for the silicide gas, $SiH_4$, $Si_2H_6$, $SiH_2Cl_2$, $SiHCl_3$, $SiCl_4$, $SiF_4$, and the like can be used. The silicide gas may also be diluted with hydrogen, or a mixture of hydrogen and one or more rare gas elements selected from helium, argon, krypton, and neon so that the SAS can be formed easily. Preferably, the dilution ratio of the silicide gas is in the range of from 1:10 to 1:1,000. The glow discharge decomposition is, of course, carried out under a reduced pressure to generate the SAS, and pressure may be approximately in the range of from 0.1 to 133 Pa. The power frequency is in the range of from 1 MHz to 120 MHz, preferably from 13 MHz to 60 MHz. The high-frequency power may be set properly. The substrate heating temperature is preferably set to 300° C. or less, preferably from 100 to 200° C. With respect to impurity elements contained upon the film deposition, each concentration of impurities resulting from atmospheric constituents such as oxygen, nitrogen, and carbon is preferably set to $1\times10^{20}/cm^3$ or less. In particular, the oxygen concentration is set to $5\times10^{19}$ atoms/$cm^3$ or less; more preferably, $1\times10^{19}$ atoms/$cm^3$ or less.

The silicide gas may also be mixed with carbide gas such as $CH_4$ and $C_2H_6$ or germanium gas such as $GeH_4$ and $GeF_4$ to set the energy bandwidth in the range of 1.5 to 2.4 eV, or 0.9 to 1.1 eV.

When an SAS is not added with an impurity element for controlling valence electrons purposely, the SAS exhibits a weak n-type conductivity due to impurities contained in the SAS. It is thought that oxygen contained in the SAS typically imparts the n-type conductivity to the SAS. The oxygen contained in the SAS is also changed depending on the high-frequency power density in the film deposition. In the invention, the oxygen concentration in the first semiconductor film 509 is preferably set to $5\times10^{19}$ atoms/$cm^3$ or less, more preferably, $1\times10^{19}$ atoms/$cm^3$ or less. Of course, all of the oxygen in the first semiconductor film does not serve as donor, and therefore, adequate doses of an impurity element should be added to control the conductivity type.

When an impurity element which imparts a p-type conductivity is added to the first semiconductor film 509 to form a channel forming region of TFTs at the same time as or after the deposition, a threshold voltage can be controlled. Typically, boron is used as an impurity element for imparting the p-type conductivity. An impurity gas such as $B_2H_6$ and $BF_3$ may be mixed into the silicide gas at a rate of 1 to 1,000 ppm. It is preferable that the concentration of boron be $1\times10^{14}$ to $6\times10^{16}$ atoms/$cm^3$.

When forming n-channel TFTs, a second semiconductor film 510 may be added with phosphorus as a typical impurity element. Specifically, an impurity gas such as $PH_3$ may be mixed into silicide gas. The second semiconductor film 510 may be formed of an SAS, an amorphous semiconductor, or a microcrystalline semiconductor, so long as the valence electrons are controlled.

The TFT manufactured above includes a structure, which can reduce the electric-field concentration and the electro-current constriction while the channel forming region is not sandwiched between a source and a drain and between LDD regions.

As set forth above, the second insulating film 508, the first semiconductor film 509, and the second semiconductor film 510 having one conductivity type can be successively formed without exposing them to the atmospheric air. Accordingly, each layer can be formed without contaminating each surface thereof with atmospheric constituents or impurity elements existing in the atmosphere, thereby reducing variation in characteristics of TFTs.

Figure 5B:
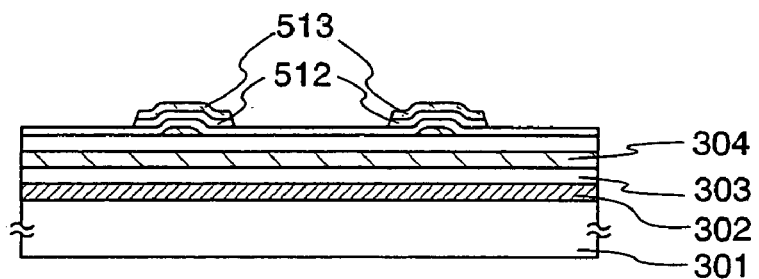

Next, as shown in FIG. 5B, a mask is formed by using a photoresist. By utilizing the mask, the first semiconductor film 509 and the second semiconductor film 510 having one conductivity type are etched to be patterned like islands (i.e., a first island-like semiconductor film 512 and a second island-like semiconductor film 513). Thereafter, the mask is removed. As substitute for the mask made from the photoresist, a mask may be formed by spraying an organic resin in a predetermined region using the droplet discharging method. In the case of using the droplet discharging method, the number of steps can be reduced since the photolithography step is not required.

Figure 5C:
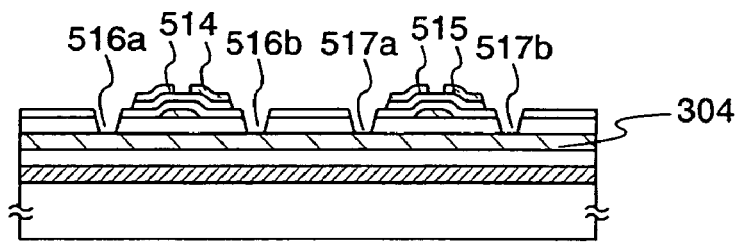

As shown in FIG. 5C, a mask (not shown) is formed on a predetermined region, and the second semiconductor film 510 having one conductivity type is partly etched to form a disconnected second semiconductor regions 514 and 515, respectively. At this moment, the second insulating film 508, which serves as a gate insulating film, and the first insulating film 305 are partly etched to form contact holes 516a, 516b, 517a, and 517b so that the anti-reduction film 304 is partly exposed.

Figure 5D:
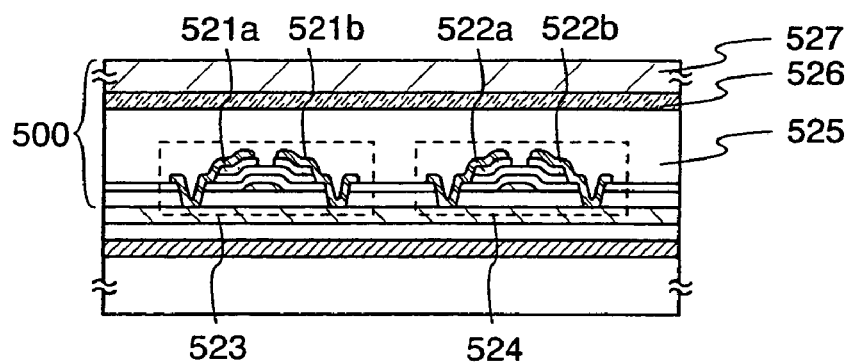

As shown in FIG. 5D, wirings (source electrodes and drain electrodes 521a, 521b, 522a, and 522b) connecting to a source region and a drain region (i.e., the disconnected second semiconductor regions 514 and 515) are formed. The source and drain electrodes can be formed as follows: aluminum or an aluminum-based conductive material is formed and etched into predetermined shapes. Also, the source and drain electrodes may have lamination structures in which lower layers contacting to the semiconductor film are made from titanium, tantalum, molybdenum, or nitrides thereof, and upper layers are made from the above mentioned aluminum or the aluminum-based conductive material. To improve the heat resistance properties, aluminum may be added with an element such as titanium, silicon, scandium, neodymium, and copper of 0.5 to 5 atomic %.

Alternatively, the source and drain electrodes can be formed as follows: a solution containing conductive particles is sprayed onto predetermined portions using the droplet discharging method and dried.

According to the above-described steps, channel-etched TFTs 523 and 524 are formed.

Afterwards, an insulating film for protecting the channel forming region is preferably formed of a silicon nitride film. A third insulating film 525 is formed on the TFTs. It is preferable that the third insulating film 525 be leveled and made from an organic resin such as acrylic, polyimide, and polyamide or an insulating film containing the Si—O bond and the Si—CHx bond. Subsequently, a second substrate 527 is attached to the surface of the third insulating film 525 by using a first adhesive material 526.

The first insulating film 305, the TFTs 523, 524, the third insulating film 525, the first adhesive material 526, and the second substrate 527 are referred to as a lamination body 500.

Figure 6A:
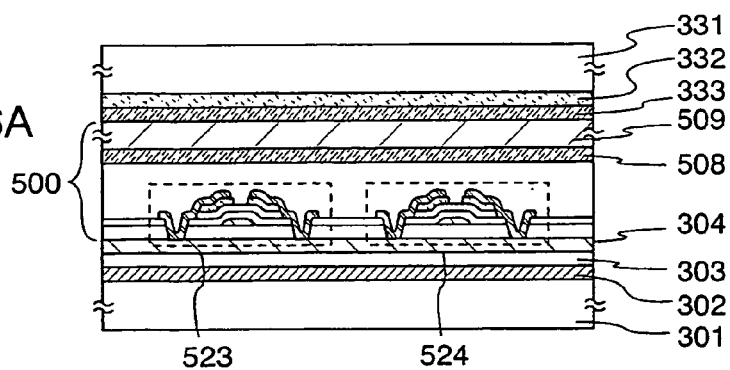
FIGS. 6A to 6E are cross sectional views explaining steps of manufacturing a semiconductor device according to the invention.
Figure 6B:
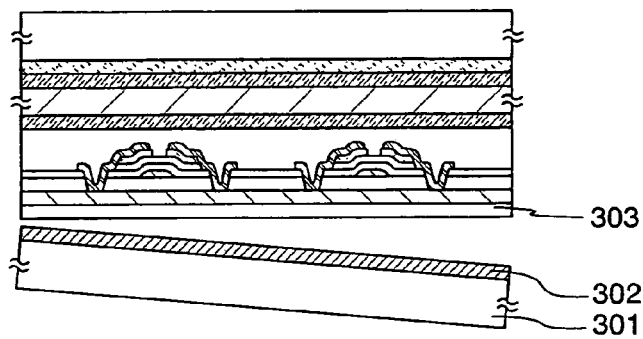

A photocatalytic layer 332 is formed on a glass substrate (e.g., a transparent substrate 331) in the same manner as Embodiment 1. As shown in FIG. 6A, the surface of the photocatalytic layer 332 is attached to the surface of the lamination body 500 by a second adhesive material 333. As shown in FIG. 6B, the lamination body 500 is separated from the first substrate 301. Concretely, the metal film 302 is separated from the oxide film 303 by a physical means.

Figure 6C:
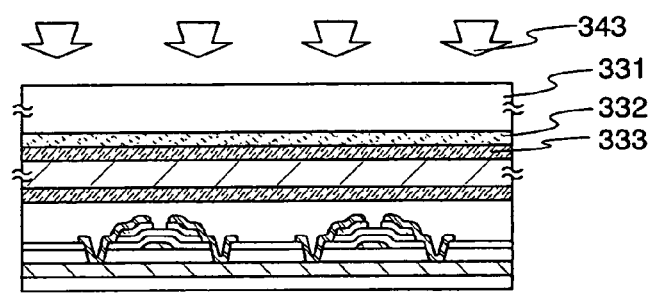
Figure 6D:
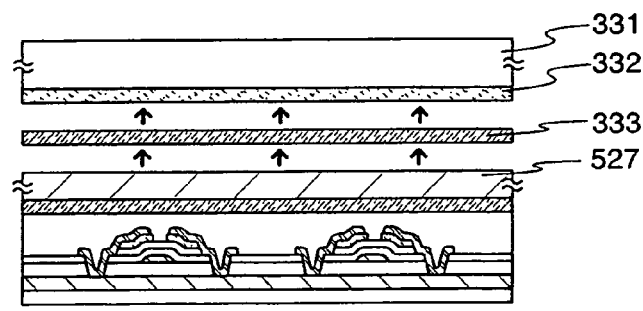

Subsequently, as shown in FIG. 6C, light 343 is irradiated from a side of the transparent substrate 331 as well as Embodiment 1. Specifically, ultraviolet light is irradiated so that the photocatalytic layer and the glass substrate are separated from the second adhesive material. The second adhesive material made from an oil-soluble resin is soaked in a solvent, e.g., ether that is filled in a container to dissolve and remove the adhesive material. If the adhesive material remains on the surface of the lamination body 500, defects might be caused. Therefore, the surface thereof is preferably washed by $O_2$ plasma irradiation, ultraviolet ray irradiation, ozone cleaning, etc. so as to remove the residue (FIG. 6D).

Figure 6E:
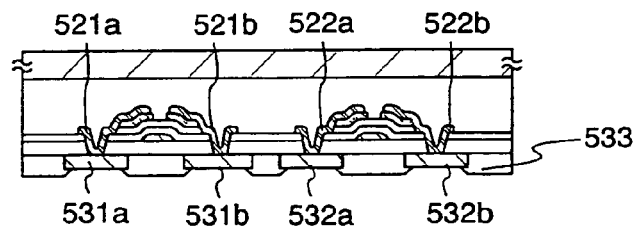

As shown in FIG. 6E, the oxide film 303 is removed by wet etching, and the anti-reduction film 304 is then etched into predetermined shapes by using a mask to form connection terminals 531a, 531b, 532a, and 532b. A fourth insulating film is formed on the insulating film 305 and the connection terminals 531a, 531b, 532a, and 532b. The fourth insulating film is partly etched to form a protective film 533 while exposing the respective connection terminals.

Thereafter, the resultant substrate may be divided in to respective circuit patterns. The present invention uses a plastic film substrate rather than the glass substrate or the quartz substrate, and hence, the substrate can be easily divided into small-sized circuit patterns by laser processing or a cutter. Accordingly, microscopic devices can be mass-produced at high yield from a large-size substrate.

Note that although the embodiment exemplifies the inverted-stagger type TFTs, the present embodiment is not particularly limited to the structure of the TFTs. For example, either top-gate TFTs or staggered TFTs can be formed. As substitute for the TFTs, an organic semiconductor transistor, a diode, and an MIM element can be used as the semiconductor elements. Furthermore, the embodiment exemplifies the SAS as the semiconductor film for the semiconductor element, however, the present embodiment is not limited thereto. An amorphous semiconductor film or a crystalline semiconductor film as shown in Embodiment 1 can be employed.

According to the invention, the lamination body can be separated at high yield without damaging the lamination body. Further, a semiconductor device including a semiconductor element can be formed on a plastic substrate. As the semiconductor device, a display device in which a pixel driving element is formed of a semiconductor element, a semiconductor device chip in which a circuit is formed using a semiconductor element, and the like are exemplified. These semiconductor devices are lightweight and thin, and comprise the impact resistance properties. In addition, a semiconductor device having a curved surface or a semiconductor device that can be varied in shape can be manufactured.

Embodiment 3

The present embodiment will describe a method of forming connection terminals that is different from that of Embodiment 2 with reference to FIGS. 7A to 7E. Note that staggered TFTs are used for the sake of explanation. An anti-reduction film is made from an insulating film.

Figure 7A:
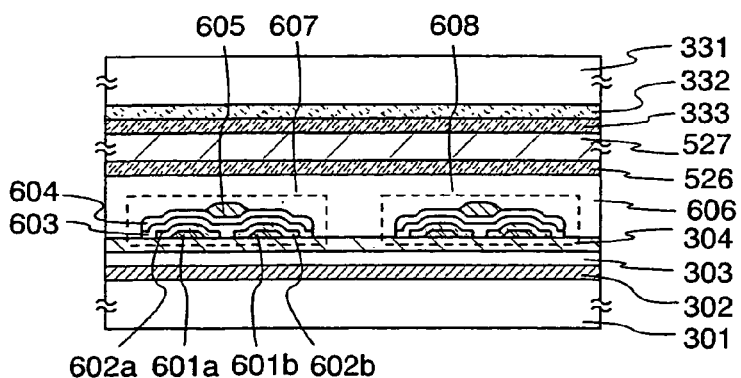
FIGS. 7A to 7E are cross sectional views explaining steps of manufacturing a semiconductor device according to the invention.

As shown in FIG. 7A, a metal film 302 with a thickness of 10 to 200 nm, preferably, 30 to 75 nm, an oxide film 303 with a thickness of 1 to 10 nm, preferably, 2 to 5 nm, an anti-reduction film 304, and a base insulating film with a thickness of 100 nm are sequentially laminated on a first substrate 301 in the same manner as Embodiment 1. As the anti-reduction film, an $AlN_XO_Y$ film is formed under an atmosphere containing a mixture of argon gas and oxygen gas in the embodiment. The $AlN_XO_Y$ film may includes several atomic % or more of nitrogen, preferably, in the range of 2.5 to 47.5 atomic %. The concentration of nitrogen can be controlled by arbitrarily adjusting the sputtering conditions (i.e., substrate temperature, raw material gas and its flow rate, film deposition pressure, and the like).

Subsequently, TFTs 607 and 608 are formed on the anti-reduction film 304. The TFT 607 is formed as follows. Source and drain electrodes 601a and 601b are formed of a conductive material, and second semiconductor films 602a, 602b, a first semiconductor film 603, and a gate insulating film 604 are sequentially laminated on the conductive layer. A gate electrode 605 is then formed to achieve the TFT 607. Similarly, the TFT 608 can be formed in the same manner as the TFT 607. Thus, the TFTs 607 and 608 (that includes the same structure as the TFT 607) can be manufactured.

A first insulating film 606 is formed on the TFTs. The first insulating film can be formed of the same material as the third insulating film of Embodiment 2. A second substrate 527 is next attached to the surface of the first insulating film 606 by using a first adhesive material 526.

Figure 7B:
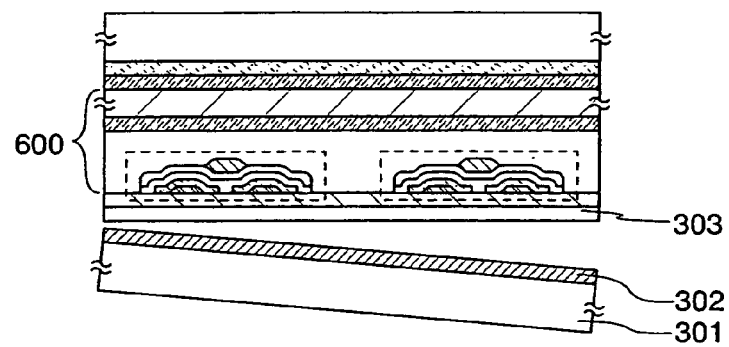

The TFT 607, 608, the first insulating film 606, the first adhesive material 526, and the second substrate 527 are referred to as a lamination body 600 (FIG. 7B).

A photocatalytic layer 332 is formed on a glass substrate (a transparent substrate 331) as well as Embodiment 1. A surface of the photocatalytic layer 332 is attached to a surface of the lamination body 600 by using a second adhesive material 333. As shown in FIG. 7B, the lamination body 600 is separated from the first substrate 301. That is, the metal film 302 is separated from the oxide film 303 by a physical means.

Figure 7C:
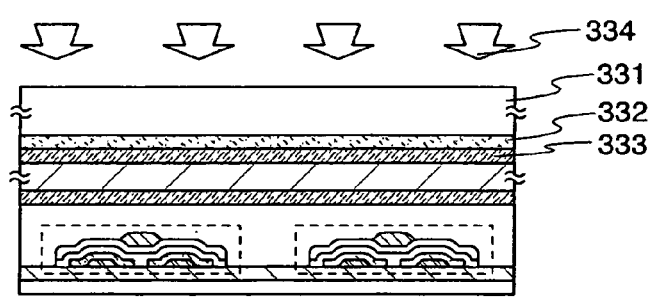
Figure 7D:
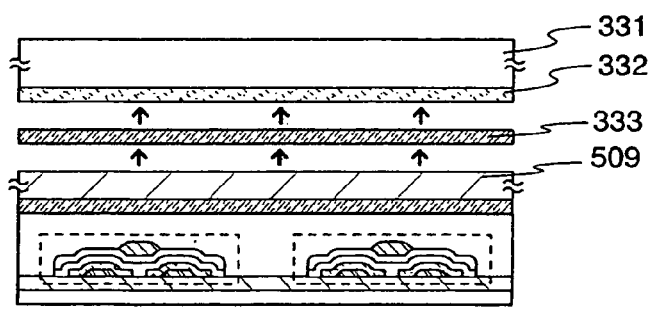

As shown in FIG. 7C, light 343 is irradiated from a side of the transparent substrate 331 as well as Embodiment 1. In the present embodiment, ultraviolet light is irradiated so that the photocatalytic layer and the glass substrate are separated from the second adhesive material 333. Subsequently, the second adhesive material made from an oil-soluble resin is soaked in a solvent, e.g., ether that is filled in a container so that the second adhesive material is dissolved and removed. If the adhesive material remains on the surface of the lamination body 600, defects might be caused. Therefore, the surface thereof is preferably washed by $O_2$ plasma irradiation, ultraviolet ray irradiation, ozone cleaning, etc. so as to remove the residue (FIG. 7D).

Figure 7E:
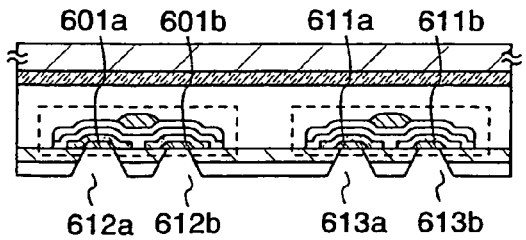

As shown in FIG. 7E, the oxide film 303 and the anti-reduction film 304 are etched into predetermined shapes by using a mask to form contact holes 612a, 612b, 613a, and 613b. The source and drain electrodes 601a, 601b, 611a, and 611b are partly exposed to serve as connection terminals. The etched oxide film and the anti-reduction film function as protective films.

Afterwards, the resultant substrate is properly divided into respective circuit patterns.

Note that although staggered TFTs are used in the embodiment, the embodiment is not particularly limited to the structure. For example, inverted-stagger type TFTs or top-gate TFTs can be used. As semiconductor elements, an organic semiconductor transistor, a diode, and an MIM element can be used, in place of the TFTs. Furthermore, the semiconductor elements is formed using the SAS, however, the embodiment is not particularly limited thereto. For example, the semiconductor elements can be formed of an amorphous semiconductor film or the crystalline semiconductor film as shown in Embodiment 1.

According to the invention, the lamination body can be separated at high yield without damaging the lamination body. Further, a semiconductor device including the semiconductor elements can be formed on a plastic substrate. As the semiconductor device, a display device in which a pixel driving element is formed of a semiconductor element, a semiconductor device chip in which a circuit is formed using a semiconductor element, and the like are cited. These semiconductor devices are lightweight and thin, and comprise the impact resistance properties. In addition, a semiconductor device having a curved surface or a semiconductor device that can be varied in shape can be manufactured.

Embodiment 4

Figure 8:
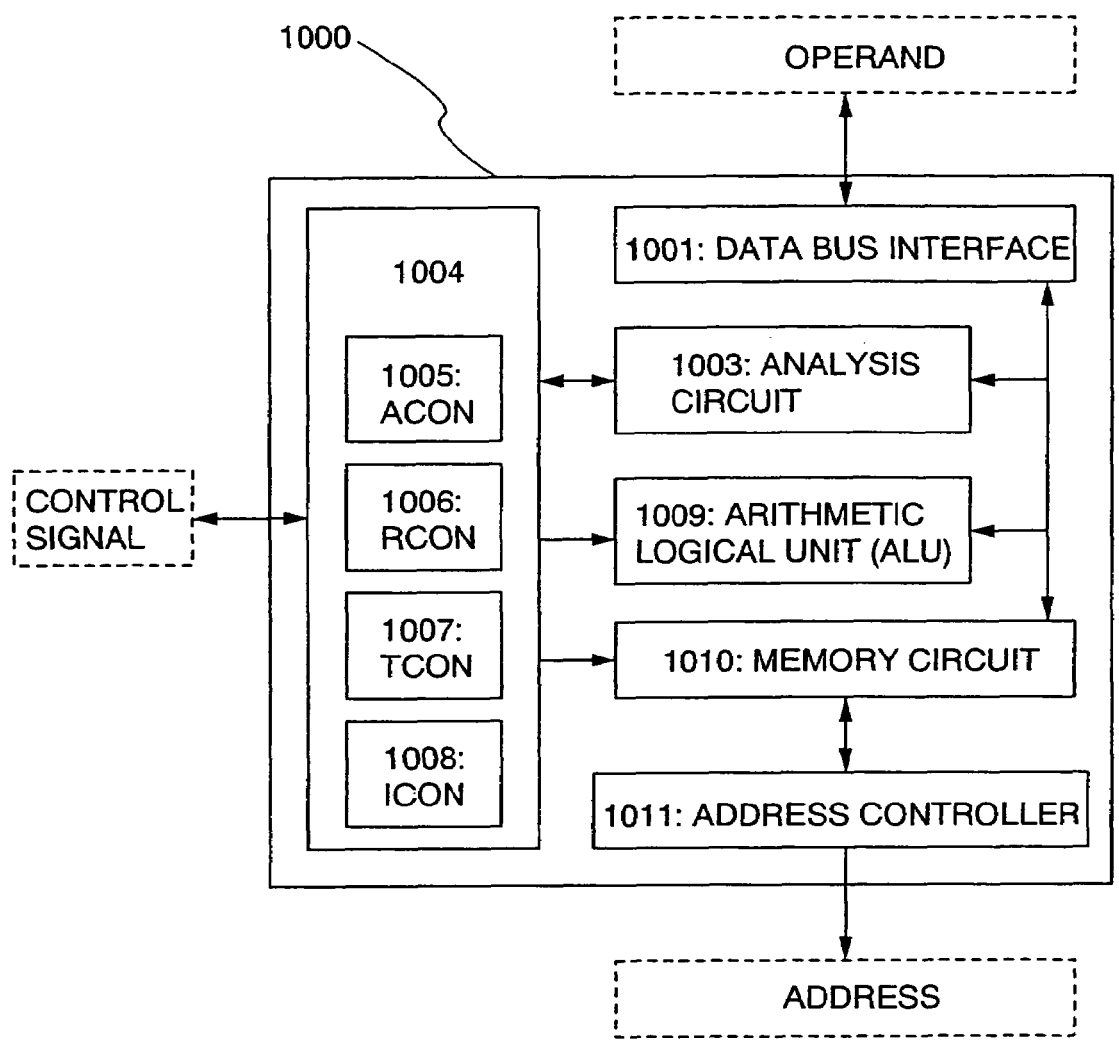
FIG. 8 is a cross sectional view showing a structure of a semiconductor device according to the invention.

A semiconductor device that can be manufactured according to any one of Embodiments 1 to 3 will be described in the present embodiment with reference to a block diagram of FIG. 8, wherein one chip of a CPU 1000 is illustrated.

When an operation code is inputted to a data bus interface 1001, the code is decoded by an analysis circuit 1003 (also referred to as an instruction decoder), and a signal is inputted to a control signal generation circuit 1004 (a CPU timing controller). Upon inputting the signal, a control signal is output to an arithmetic logical unit 1009 (hereinafter, an ALU) and a memory circuit 1010 (hereinafter, a register) from the control signal generation circuit 1004.

The control signal generation circuit 1004 comprises an ALU controller 1005 for controlling the ALU 1009 (hereinafter, ACON); a circuit 1006 for controlling the register 1010 (hereinafter, a RCON), a timing controller 1007 for controlling timing (hereinafter, a TCON), and an interruption controller 1008 for controlling interruption (hereinafter, an ICON).

On the other hand, when an operand is inputted to the interface 1001, the operand is outputted to the ALU 1009 and the register 1010. Then, a processing (such as a memory read cycle, a memory write cycle, an I/O read cycle, and an I/O write cycle) based on the control signal, which is inputted from the control signal generation circuit 1004, is carried out.

The register 1010 includes a general register, a stack pointer (SP), a programmable counter (PC), and the like.

An address controller 1011 (hereinafter, ADRC) outputs 16 bits address.

A structure of the CPU described in this embodiment is illustrative only as a CPU manufactured according to the method of the present invention and does not limit the structure of the present invention. Therefore, it is possible to use a known CPU with a structure other than that of the present embodiment.

Note that the present embodiment can be implemented by being freely combined with Embodiment Mode 1 or 2.

Embodiment 5

The present embodiment will explain a method of mounting a semiconductor device chip, e.g., a CPU with reference to FIGS. 19A to 19D. The mounting method may use the connection method with use of an anisotropic conductive adhesive material, the wire bonding method, and the like. Examples of the mounting methods will be described below.

Figure 19A:
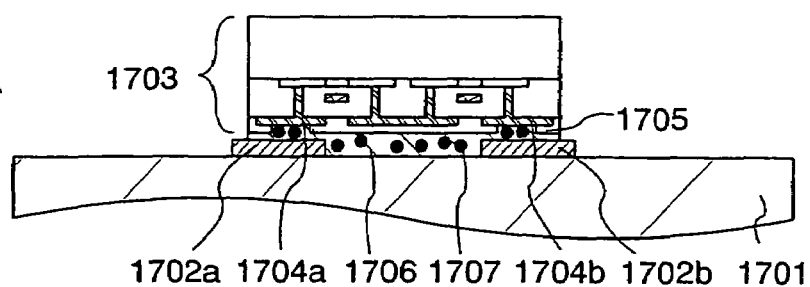
FIGS. 19A to 19D are diagrams showing examples of implementing a method for mounting a semiconductor device according to the invention.

FIG. 19A show an example in which a CPU 1703 is mounted on a wiring substrate 1701 by using an anisotropic conductive adhesive material 1706. A wiring (now shown) and electrode pads 1702a, 1702b, which are extraction electrodes for the wiring, are formed on the wiring substrate 1701.

Connection terminals 1704a and 1704b are provided on the surface of the CPU 1703, and a protective insulating film 1705 is formed in a periphery thereof.

The CPU 1703 is fixed on the wiring substrate 1701 by an anisotropic conductive adhesive material 1706. The connection terminals 1704a, 1704b and the electrode pads 1702a, 1702b are electrically connected to one another by conductive particles 1707 contained in the anisotropic conductive adhesive material. The anisotropic conductive adhesive material is an adhesive resin in which the conductive particles (with a grain size of 3 to 7 μm) are dispersed. An epoxy resin, a phenol resin, and the like can be cited as examples of the anisotropic conductive adhesive material. The conductive particles (with a grain size of several μm to several hundred μm) are made from an element selected from gold, silver, copper, palladium, and platinum, or alloy particles including the plural elements. Or, conductive particles formed by laminating the above-mentioned elements may be used. Further, particles in which resin particles are coated with one element selected from gold, silver, copper, palladium, and platinum, or an alloy containing the plural elements may also used.

As substitute for the anisotropic conductive adhesive material, it is possible to use an anisotropic conductive film that is transferred on a base film. The conductive particles that are identical to those in the anisotropic conductive adhesive material are dispersed in the anisotropic conductive film. The size and density of the conductive particles 1707 mixed in the anisotropic conductive adhesive material 1706 are adjusted adequately so that the CPU can be mounted on the wiring substrate as illustrated in FIG. 19A.

Figure 19B:
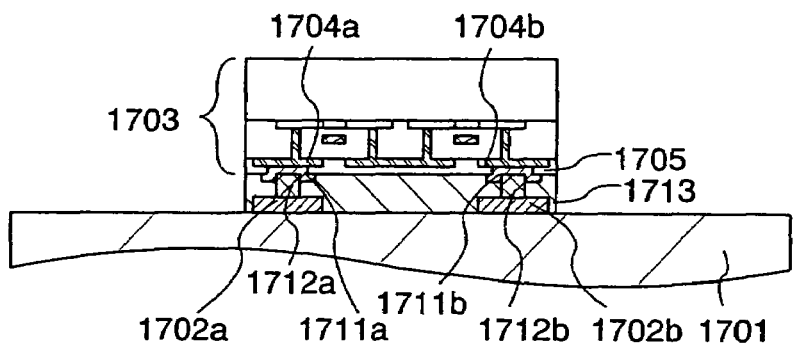

FIG. 19B shows an example of a mounting method that utilizes shrinkage of an organic resin. Barrier films 1711a and 1711b are formed on a surface of the connections terminals 1704a and 1704b of the CPU 1703 by using Ta, Ti, and the like, and Au with a thickness of about 20 μm is formed thereon by electroless deposition so as to form bumps 1712a and 1712b. The bumps are mounted on the CPU. When a light curable insulating resin 1713 is interposed between the CPU and a wiring substrate 1701, the resin is cured by irradiating with light. By utilizing the shrinkage of the resin that is cured due to irradiation of light, the CPU can be mounted on the wiring substrate.

Figure 19C:
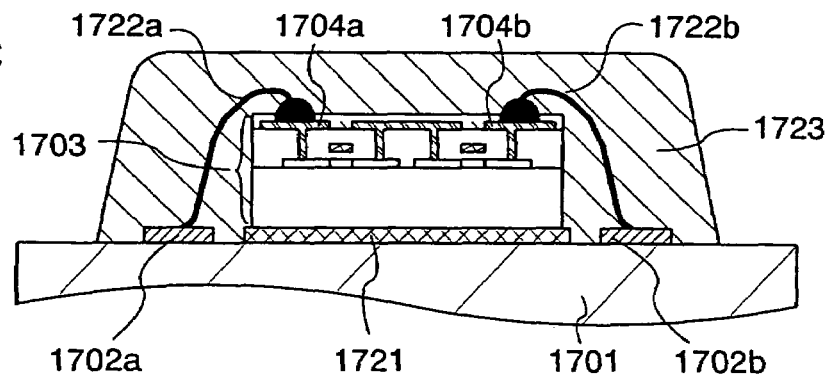

As shown in FIG. 19C, the CPU 1703 may be mounted on the wiring substrate 1701 as follows. The CPU 1703 is fixed on the wiring substrate 1701 by using an adhesive material 1721, and the connection terminals 1704a, 1704b of the CPU and the electrode pads 1702a, 1702b formed on the wiring substrate are connected to one another by Au wirings 1722a and 1722b. The CPU is then sealed with an organic resin 1723.

Figure 19D:
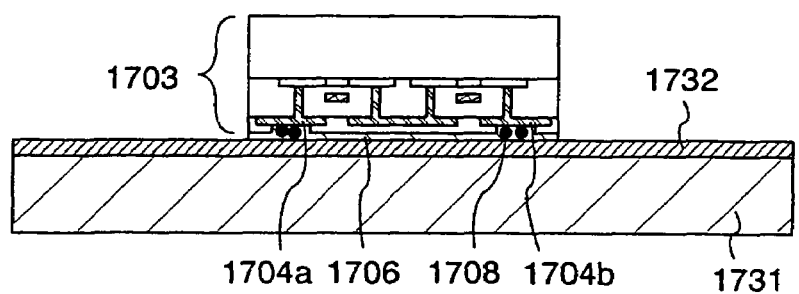

As shown in FIG. 19D, a wiring 1732 on a FPC (flexible printed circuit) 1731 is connected to an anisotropic conductive adhesive material 1706 containing conductive particles 1708 so that the CPU 1703 may be provided on the FPC. This structure is extremely effective in the case of forming an electronic appliance that is limited in the size of a housing such as a portable terminal.

Note that the method of mounting the semiconductor device is not particularly limited to the above-described methods, and a known reflow processing with use of solder pumps can be performed. When performing the reflow processing, it is preferable that a substrate of a semiconductor device is made from excellent heat-resistant plastic, typically, a polyimide substrate, a HT substrate (manufactured by Nippon Steel Chemical Co., Ltd.), ARTON made from a norbornene resin with a polar radical (manufactured by JSR Corporation), and the like.

Embodiment 6

The present embodiment will explain a method of manufacturing a light emitting display device that is one embodiment of a semiconductor device with reference to FIGS. 9A to 9D.

Figure 9A:
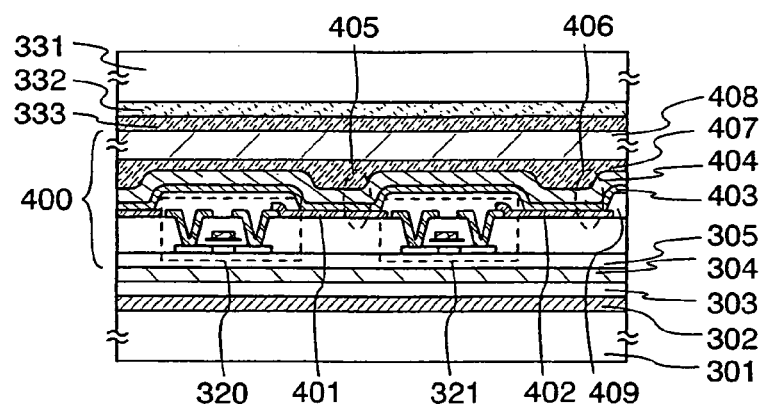
FIGS. 9A to 9D are cross sectional views explaining steps of manufacturing a semiconductor device according to the invention.

A lamination body 400 is formed on a first substrate 301 shown in FIG. 3A in the same manner as Embodiment 1. As shown in FIG. 9A, a conductive film connecting to TFTs (p-channel TFTs) 320 and 321 is formed thereon and etched into a pixel size to form first pixel electrodes 401 and 402. In the embodiment, in order to form a top-emission type light emitting element, the first electrodes 401 and 402 are formed of a conductive film with a light-shielding property, and TiN is used here. An insulator 409 (also referred to as a bank, a partition wall, barrier, embankment, etc.) for covering edges of the first electrodes 401 and 402 is formed by a known method such as CVD, PVD, and application. The insulator 409 can be made from an inorganic material (such as silicon oxide, silicon nitride, and silicon oxynitride); a photosensitive or nonphotosensitive organic material (such as polyimide, acrylic, polyamide, polyimide amide, resist, and benzocyclobutene); a lamination thereof; and the like.

A layer 403 containing a luminescent substance is next formed by vapor deposition, application, ink-jet, etc. The layer containing the luminescent substance is formed by combining a hole injecting layer, a hole transporting layer, an electron injecting layer, and an electron transporting layer, along with a light emitting layer. In addition, the layer containing the luminescent substance may be formed using any known structures. The light emitting layer may be formed of either an organic material or an inorganic material. When the light emitting layer is made from an organic material, either a high molecular weight material or a low molecular weight material can be used. Preferably, degasification is performed by vacuum heating prior to forming the layer 403 containing the luminescent substance to improve the reliability. When using vapor deposition, for example, vapor deposition is carried out in a film formation chamber, which is vacuum evacuated up to a level of $5 \times 10^{-3}$ Torr (0.665 Pa) or less, preferably, in the range of from $10^{-4}$ to $10^{-6}$ Pa.

A second electrode 404 is formed on the layer 403 containing the luminescent substance. The second electrode is made from a transparent conductive film, and an ultra thin film of aluminum-lithium alloy is, herein, used.

Light emitting elements 405 and 406 include the first pixel electrodes 401, 402, the layer 403 containing the luminescent substance, and the second electrode 404, respectively.

Subsequently, a second substrate 408 is attached to a surface of the second electrode 404 by a sealing material 407. As the sealing material, an epoxy resin is, herein, used. A transparent substrate 331 on which a photocatalytic layer 332 is formed is attached to the surface of the second substrate 408 by using a first adhesive material 333.

Figure 9B:
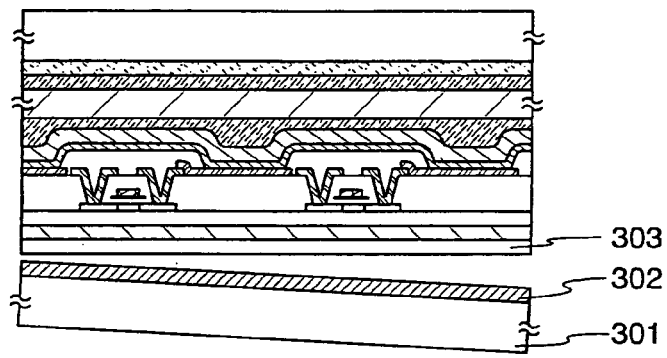

As shown in FIG. 9B, the metal film 302 and the first substrate 301 are removed from the oxide film 303.

Figure 9C:
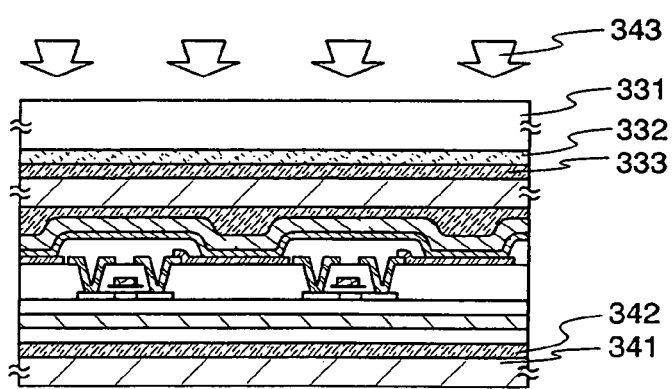

As shown in FIG. 9C, a third substrate 341 is attached to the surface of the oxide film 303 by a third adhesive material 342. The second substrate is made from polycarbonate, while the third adhesive material is made from an epoxy resin in the embodiment.

Figure 9D:
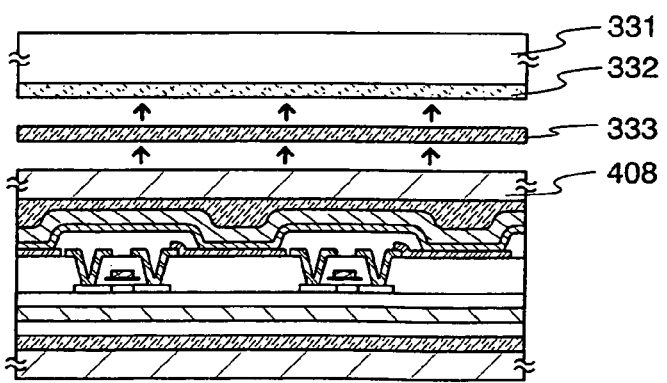

Light 343, e.g., ultraviolet light, is irradiated from a side of the transparent substrate 331. By irradiating the ultraviolet light to the photocatalytic layer 332, an oxidation-reduction reaction is caused in the second adhesive material that is in contact with the photocatalytic layer to decompose the organic resin, reducing the adhesive property of the adhesive material. Consequently, the photocatalytic layer 332 and the transparent substrate 331 are separated the second adhesive material 333. Thereafter, the second adhesive material 333 made from an oil-soluble resin is soaked in a solvent, e.g., ether that is filled in a container so as to dissolve and remove the adhesive material. As a result, a light emitting display device formed using the plastic substrate can be fabricated as shown in FIG. 9D.

In the case of forming a semiconductor device with light emitting elements that emit light toward the second substrate, i.e., upward, when an anti-reduction film is formed of a material having a light-shielding property, the anti-reduction film can serve as a light-shielding film that prevents outside light from intruding into the semiconductor elements. In this case, a semiconductor device having less failure of the semiconductor elements with high reliability can be manufactured.

In the case of forming a semiconductor device with light emitting elements that emit light downward or both upward and downward, i.e., at least toward the third substrate 341, when the anti-reduction film is formed of a material having a light-shielding property, the anti-reduction film is preferably removed by etching.

The present embodiment can be applied to the steps of Embodiment Mode 2, in place of those of Embodiment Mode 1. Also, bottom-emission type light emitting elements or dual-emission type light emitting elements can be formed as substitute for the top-emission type light emitting elements. In such case, the anti-reduction film should be made from a film having a light-transmitting property. Or, the oxide film and the anti-reduction film having the light-shielding property must be removed to emit light downwardly.

According to the embodiment, a semiconductor device having semiconductor elements can be formed on a plastic substrate. That is, a display device in which a pixel driving element is formed of a TFT can be fabricated. Such a semiconductor device is lightweight, thin and comprises an excellent impact resistance property. In addition, a semiconductor device with a curved surface or a semiconductor device that can be varied in shape can be manufactured.

Embodiment 7

Figure 10A:
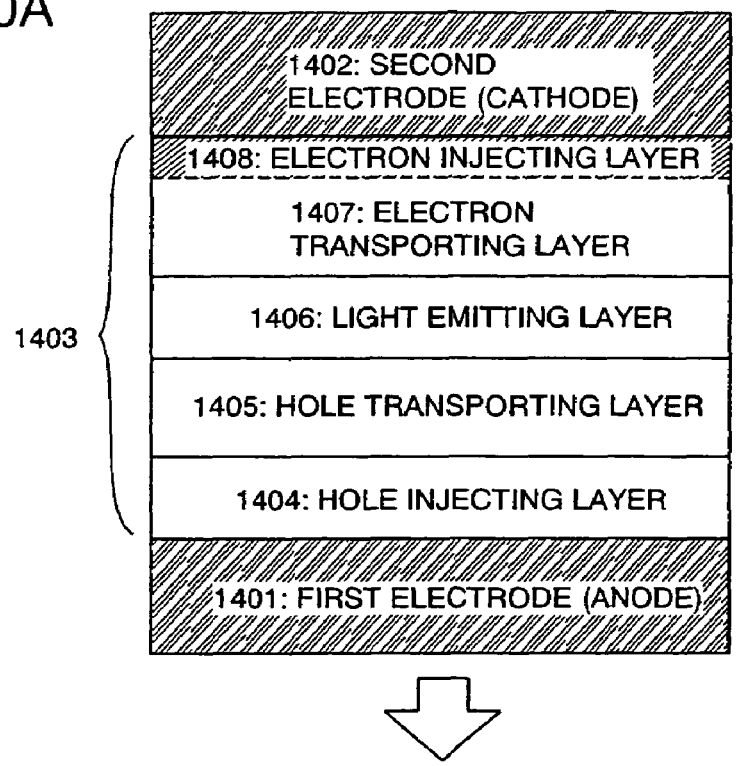
FIGS. 10A and 10B are diagrams showing structures of light emitting elements.
Figure 10B:
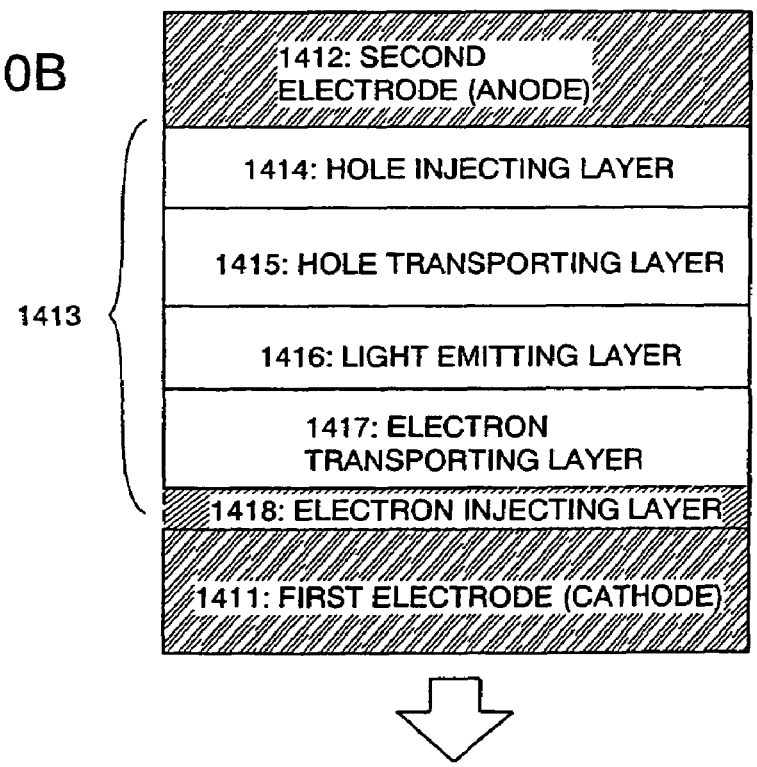

The present embodiment will describe structures of light emitting elements that are applicable to any one of Embodiment Modes 1, 2, and 6 with reference to FIGS. 10A and 10B.

A light emitting element includes a pair of electrodes (i.e., an anode and a cathode), and a layer containing a luminescent substance that is sandwiched between the anode and the cathode. Hereinafter, first electrodes represent electrodes provided on the sides of the anti-reduction film of Embodiment Mode 1 and the second substrate of Embodiment Mode 2, whereas second electrodes represent electrodes that are provided opposite of the anti-reduction film and the second electrode.

The layer containing the luminescent substance includes at least a light emitting layer, and is formed by laminating one or more of layers having different properties with respect to carries such as a hole injecting layer, a hole transporting layer, a blocking layer, an electron transporting layer, and an electron injecting layer, along with the light emitting layer.

FIGS. 10A and 10B show examples of cross sectional structures for light emitting elements.

In FIG. 10A, a layer 1403 containing a luminescent substance is composed by sequentially laminating a hole injecting layer 1404, a hole transporting layer 1405, a light emitting layer 1406, an electron transporting layer 1407, and an electron injecting layer 1408 on a first electrode (anode) 1401. A second electrode (cathode) 1402 is provided on the electron injecting layer 1408 to complete a light emitting element. When a TFT for driving the light emitting element is provided in the first electrode (anode), a p-channel TFT is used as the TFT.

Meanwhile, in FIG. 10B, a layer 1413 containing a luminescent substance is composed by sequentially laminating an electron injecting layer 1418, an electron transporting layer 1417, a light emitting layer 1416, a hole transporting layer 1415, and a hole injecting layer 1414 on a first electrode (cathode) 1411. A second electrode (anode) 1412 is provided on the hole injecting layer 1414 to complete a light emitting element. When a TFT for driving the light emitting element is provided in the first electrode (cathode), an n-channel TFT is used as the TFT.

Note that this embodiment is not limited to the above structures. For example, various types of structures can be employed for the light emitting elements as follows: a structure of an anode/a hole injecting layer/a light emitting layer/an electron transporting layer/and a cathode; a structure of an anode/a hole injecting layer/a hole transporting layer/a light emitting layer/an electron transporting layer/an electron injecting layer/and a cathode; a structure of an anode/a hole injecting layer/a hole transporting layer/a light emitting layer/a hole blocking layer/an electron transporting layer/and a cathode; a structure of an anode/a hole injecting layer/a hole transporting layer/a light emitting layer/a hole blocking layer/an electron transporting layer/an electron injecting layer/and a cathode; and the like. Note that a stripe arrangement, a delta arrangement, a mosaic arrangement and the like can be cited as the arrangement of a light-emitting region, i.e., the arrangement of a pixel electrode.

When the light emitting elements emit light upward, i.e., toward the second electrodes 1402 and 1412, respectively, the first electrodes 1401 and 1411 are made from conductive films with light-shielding properties. In FIG. 10A, the first electrode 1401 serves as an anode, and hence, can be formed of a single layer of TiN, ZrN, Ti, W, Ni, Pt, Cr, Al, etc., a lamination layer in combination with a titanium nitride film and an aluminum-based film, a three-layer structure of a titanium nitride film, an aluminum-based film, and another titanium nitride film, or the like.

In FIG. 10B, the first electrode 1411 serves as a cathode, and therefore, can be formed of alkali metal (such as Li and Cs), alkali earth metal (such as Mg, Ca, and Sr), an alloy containing the alkali metal and alkali earth metal (such as Mg:Ag and Al:Li), or rare earth metal (such as Yb and Er). In the case of using an electron injecting layer made from LiF, CsF, $CaF_2$, $Li_2O$, or the like, a normal thin conductive film such as aluminum can be used as the first electrode.

The second electrodes 1402 and 1412 comprise polar characters corresponding to the first electrodes 1401 and 1411, respectively, and are made from transparent conductive materials. In FIG. 10A, the second electrode 1402 serves as the cathode, and can be formed by laminating a transparent conductive film (ITO, IZO, ZnO, etc.) and an ultra thin film containing alkali metal (such as Li and Cs) and alkali earth metal (such as Mg, Ca, and Sr). Or, the second electrode 1402 may be formed by co-depositing an electron transporting material with alkali metal or alkali earth metal, and laminating a transparent conductive film (such as ITO, IZO, and ZnO) thereon.

In FIG. 10B, the second electrode 1412 serves as the anode, and is made from a transparent conductive material such as indium-tin oxide (ITO) and indium-zinc oxide (IZO).

When the light emitting elements emit light downward, i.e., toward the first electrodes 1401 and 1411, the first electrodes 1401 and 1411 are made from transparent conductive films. In FIG. 10A, the first electrode (anode) 1401 is formed of the above transparent conductive materials for the anode. In FIG. 10B, the first electrode (cathode) 1401 is made from the above transparent conductive materials for the cathode.

The second electrode 1402 and 1412 comprise polar characters corresponding to the first electrodes 1401 and 1411, respectively, and are made from conductive films having light-shielding properties. In FIG. 10A, the second electrode (cathode) 1402 is made from the above materials having the light-shielding properties for the cathode. In FIG. 10B, the second electrode (anode) 1412 is made from the above materials having the light-shielding properties for the anode.

In FIGS. 10A and 10B, when the first electrodes 1401, 1411 and the second electrodes 1402, 1412 are formed of the above-mentioned transparent conductive materials for the anodes and the above-mentioned transparent conductive materials for the cathodes, respectively, light can be emitted toward both the first electrodes and the second electrodes.

The layers 1403 and 1413 containing the luminescent substances can be formed of conventional organic compounds such as a low molecular weight material, a high molecular weight material, and a middle molecular weight material typified by oligomer, dendrimer, and the like. Also, a light emitting material (singlet compound) that emits light (fluorescence) by singlet excitation or a light emitting material (triplet compound) that emits light (phosphorescence) by triplet excitation can be used.

Next, specific examples of materials for the layers 1403 and 1413 containing the luminescent substances are shown below.

In the case of an organic compound, porphyrin compounds are effective as the hole injecting materials for forming the hole injecting layers 1404 and 1414, and phthalocyanine (hereinafter referred to as $H_2$-Pc), copper phthalocyanine (hereinafter, Cu-Pc), and the like can be used. As for the hole injecting materials, there is also materials in which conductive polymer compounds are subjected to chemical doping such as polyethylene dioxythiophene (hereinafter, PEDOT) doped with polystyrene sulfonate (hereinafter, PSS), polyaniline (hereinafter, PAni), and polyvinyl carbazole (hereinafter, PVK). It is also effective to use a thin film made from an inorganic semiconductor such as vanadium pentoxide or an ultra thin film made from an inorganic insulator such as aluminum oxide.

As hole transporting materials used for forming the hole transporting layers 1405 and 1415, aromatic amine-based compounds (i.e., substances having benzene ring-nitrogen bonds) are preferred. As the commonly-used materials, for example, there are N,N'-bis(3-methylphenyl)-N,N'-diphenyl-1,1'-biphenyl-4,4'-diamine (abbreviation: TPD); a derivative thereof such as 4,4'-bis[N-(1-naphthyl)-N-phenyl-amino]-biphenyl (abbreviation: α-NPD); and the like. Further, star burst aromatic amine compounds such as 4,4',4"-tris(N,N-diphenyl-amino)-triphenylamine (abbreviation: TDATA), and 4,4',4"-tris[N-(3-methylphenyl)-N-phenyl-amino]-triphenylamine (abbreviation: MTDATA) can also be cited.

Specific examples of the light emitting materials used for forming the light emitting layers 1406 and 1416 include: metal complexes such as tris(8-quinolinolate)aluminum (abbreviation: $Alq_3$), tris(4-methyl-8-quinolinolate)aluminum (abbreviation: $Almq_3$), bis(10-hydroxybenzo[h]quinolinato) beryllium (abbreviation: $BeBq_2$), bis(2-methyl-8-quinolinolate)-(4-hydroxy-biphenylyl)-aluminum (abbreviation: BAlq), bis[2-(2-hydroxyphenyl)-benzoxazolate]zinc (abbreviation: $Zn(BOX)_2$), and bis[2-(2-hydroxyphenyl)-benzothiazolate]zinc (abbreviation: $Zn(BTZ)_2$). In addition, various kinds of fluorescent dyes are effective for the material of the light-emitting layers. It is also possible to use triplet luminescent materials in which complexes include platinum or iridium as their central metal. For example, the followings are known as the triplet luminescent materials: tris(2-phenylpyridine) iridium (abbreviation: $Ir(Ppy)_3$); 2,3,7,8,12,13,17,18-octaethyl-21H,23H-porphyrin-platinum (abbreviation: PtOEP); and the like.

As electron transporting materials for forming the electron transporting layers 1407 and 1417, the following metal complexes can be cited: tris(8-quinolinolate)aluminum (abbreviation: $Alq_3$); tris(4-methyl-8-quinolinolate)aluminum (abbreviation: $Almq_3$); bis(10-hydroxybenzo[h]quinolinato) beryllium (abbreviation: $BeBq_2$); bis(2-methyl-8-quinolinolate)-(4-hydroxy-biphenylyl)-aluminum (abbreviation: BAlq); bis[2-(2-hydroxyphenyl)-benzoxazolate]zinc (abbreviation: $Zn(BOX)_2$); bis[2-(2-hydroxyphenyl)-benzothiazolate]zinc (abbreviation: $Zn(BTZ)_2$); and the like. In addition to the metal complexes, the electron transporting layers are made from materials as follows: oxadiazole derivatives such as 2-(4-biphenyl)-5-(4-tert-butylphenyl)-1,3,4-oxadiazole (abbreviation: PBD), and 1,3-bis[5-(p-tert-butylphenyl)-1,3,4-oxadiazole-2-yl]benzene (abbreviation: OXD-7); triazole derivatives such as 3-(4-tert-butylphenyl)-4-phenyl-5-(4-biphenylyl)-1,2,4-triazole (abbreviation: TAZ), and 3-(4-tert-butylphenyl)-4-(4-ethylphenyl)-5-(4-biphenylyl)-1,2,4-triazole (abbreviation: p-EtTAZ); imidazole derivatives such as 2,2',2"-(1,3,5-benzenetriyl)tris[1-phenyl-1H-benzimidazole] (abbreviation: TPBI); and phenanthroline derivatives such as bathophenanthroline (abbreviation: BPhen) and bathocuproin (abbreviation: BCP).

As electron injecting materials used for forming the electron injecting layers 1408 and 1418, the above-mentioned electron transporting materials can be used. Besides, an ultra thin film made from an insulator such as alkali metal halides (e.g., LiF and CsF), alkali earth halides (e.g., $CaF_2$), and alkali metal oxides (e.g., $Li_2O$) is frequently used. In addition, alkali metal complexes such as lithium acetylacetonate (abbreviation: Li(acac)) and 8-quinolinolate-lithium (abbreviation: Liq) can also be used effectively.

In the case of forming a light emitting display device according to the present embodiment, full color display can be achieved by making the layer containing the luminescent substance to emit white light while forming a color filter, additionally. Alternatively, full color display can be performed by making a layer containing a luminescent substance to emit blue light while providing a color conversion layer and the like, additionally.

Further, material layers emitting red, green, and blue lights, respectively, are formed in the layers 1403 and 1413 containing the luminescent substances so that full color display can be achieved. A light emitting display device using a color filter exhibits high color purity of respective R, G, and B so that high definition display can be performed.

Embodiment 8

Figure 11A:
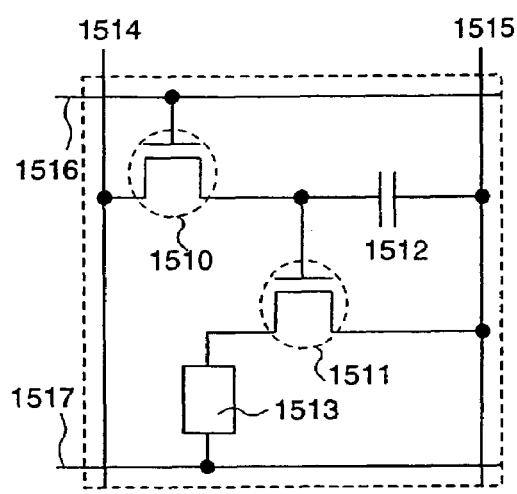
FIGS. 11A to 11C are circuit diagrams of pixels for light emitting elements.

Circuit diagrams of pixels for a light emitting display device corresponding to one embodiment of the semiconductor device according to the invention will be described with reference to FIGS. 11A to 11C. FIG. 11A is an equivalent circuit diagram of a pixel, including a signal line 1514, a power supply lines 1515, 1517, a scanning line 1516, a light emitting element 1513, a TFT 1510 for controlling input of video signals to the pixel, a TFT 1511 for controlling the amount of current that flows between electrodes, and a capacitor element 1512 for holding a gate-source voltage. Although the capacitor element 1512 is shown in FIG. 11A, it may not be provided in the case where a gate capacitance or the other parasitic capacitance can serve as a capacitor for holding the gate-source voltage.

Figure 11B:
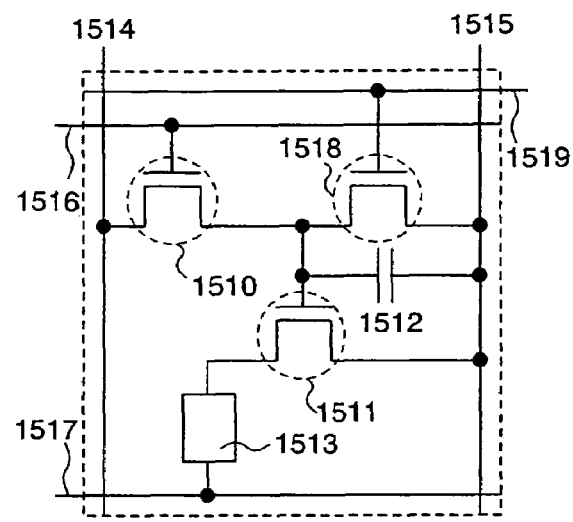

FIG. 11B shows a pixel circuit having a structure in which a TFT 1518 and a scanning line 1519 are additionally provided to the pixel shown in FIG. 11A. Supply of the current to the light emitting element 1513 can be forcibly stopped due to the arrangement of the TFT 1518, thereby starting a lighting period simultaneously with or immediately after a writing period starts before signals are written in all of the pixels. Therefore, duty ratio is increased, and in particular, moving image can be displayed favorably.

Figure 11C:
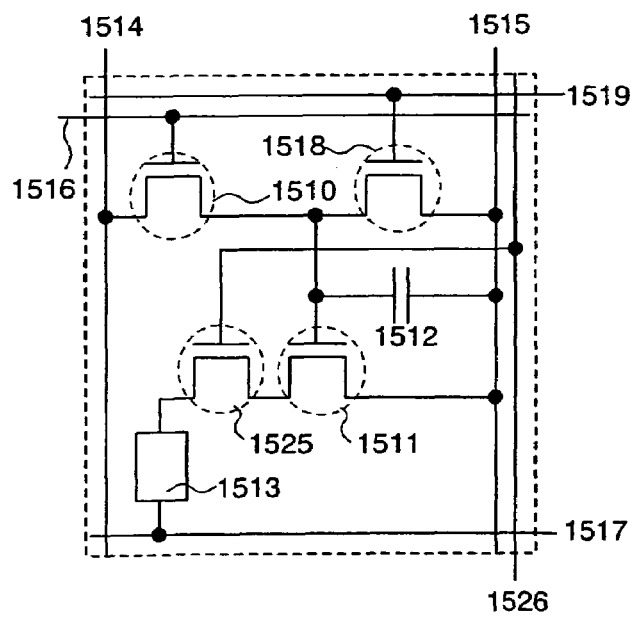

FIG. 11C shows a pixel circuit in which a TFT 1525 and a wiring 1526 are additionally provided to the pixel shown in FIG. 11B. In the structure, a gate electrode of the TFT 1525 is connected to a wiring 1526 maintaining a constant potential so that the potential for the gate electrode is fixed. Further, the TFT 1525 is operated in a saturation region. The TFT 1511 is connected to the TFT 1525 in series and operated in a linear region. A gate electrode of the TFT 1511 is input with video signals for transmitting information about lighting or non-lighting of the pixel via the TFT 1510. Since the source-drain voltage for the TFT 1511 that is operated in the linear region is low, slight variation in the gate-source voltage of the TFT 1511 does not adversely affect the amount of current flowing through the light emitting element 1513. Therefore, the amount of current flowing through the light emitting element 1513 is determined by the TFT 1525, which is operated in the saturation region. According to the invention having the above-mentioned structure, luminance fluctuation of the light emitting element 1513, which is caused due to fluctuation in the characteristics of the TFT 1525, can be reduced, thereby improving the image quality. It is preferable that the channel length $L_1$ and the channel width $W_1$ for the TFT 1525, and the channel length $L_2$ and the channel width $W_2$ for the TFT 1511 be set to satisfy the relation of $L_1/W_1:L_2/W_2=5$ to 6,000:1. It is also preferable that the TFTs 1525 and 1511 comprise a same conductivity type from the viewpoint of the manufacturing steps. The TFT 1525 may be either an enhancement TFT or a depletion TFT.

In the light emitting display device of the invention, the method of driving screen display is not particularly limited. For example, a dot sequential driving method, a line sequential driving method, a surface sequential driving method, and the like may be used. The line sequential driving method is typically used, and a time division gray scale driving method or a surface area gray scale driving method may also be employed appropriately. Further, a source line of the light emitting display device may be input with either analog signals or digital signals. A driver circuit and the like may be designed properly according to the image signals.

Light emitting display devices using digital video signals are classified into one in which video signals are input to a pixel at a constant voltage (CV), and another one in which video signals are input to a pixel at a constant current (CC). The light emitting devices in which video signals are input to a pixel at a constant voltage (CV) are further classified into one in which a constant voltage is applied to a light emitting element (CVCV), and another one in which a constant current is supplied to a light emitting element (CVCC). The light emitting devices in which video signals are input to a pixel at a constant current (CC) is still classified into one in which a constant voltage is applied to a light emitting element (CCCV), and another one in which a constant current is supplied to a light emitting element (CCCC).

In the light emitting display device according to the invention, a protection circuit (e.g., a protection diode and the like) may be provided to the driver circuits or the pixel portion to inhibit electrostatic discharge damage.

Embodiment 9

In the present embodiment, an exterior appearance of a light emitting display device panel corresponding to one embodiment of the semiconductor device according to the invention will be explained with reference to FIGS. 12A and 12B. FIG. 12A is a tow view of a panel in which a first substrate and a second substrate are sealed with a first sealing material 1205 and a second sealing material 1206, while FIG. 12B is a cross sectional view taken along a line A-A' of FIG. 12A.

In FIG. 12A, reference numeral 1201 denoted by a doted line represents a signal line driver circuit; 1202, a pixel portion; and 1203, a scanning line driver circuit. In the embodiment, the signal line driver circuit 1201, the pixel portion 1202, and the scanning line driver circuit 1203 are positioned within a region sealed with the first and second sealing materials. As the first sealing material, an epoxy resin containing filler with high viscosity is preferably used. As the second sealing material, an epoxy resin having low viscosity is preferably used. Further, it is desirable that the first and second sealing materials 1205, 1206 be materials that do not transmit moisture and oxygen as much as possible.

Reference numeral 1240 denotes a connection wiring for transmitting signals inputted in the signal line driver circuit 1201 and the scanning line driver circuit 1203, and receives video signals and clock signals from an FPC (flexible printed circuit) 1209, which becomes an external input terminal, via a connection wiring 1208.

Next, a cross sectional structure will be described referring to FIG. 12B. The first substrate 1200 is provided with driver circuits and a pixel portion along with plural semiconductor elements typified by TFTs. As for the driver circuits, the signal line driver circuit 1201 and the pixel portion 1202 are illustrated. A CMOS circuit formed in combination with an n-channel TFT 1221 and a p-channel TFT 1222 is provided as the signal line driver circuit 1201.

Since the TFTs of the signal line driver circuit, the scanning line driver circuit, and the pixel portion are formed on the same substrate in the present embodiment, the volume of the light emitting display device can be reduced.

The pixel portion 1202 includes a plurality of pixels having a switching TFT 1211, a driver TFT 1212, and a first electrode (anode) 1213 made from a conductive film with a light-shielding property, which is electrically connected to a drain of the driver TFT 1212.

An interlayer insulating film 1220 of these TFTs 1211, 1212, 1221, and 1222 may be formed of a material containing an inorganic material (such as silicon oxide, silicon nitride, and silicon oxynitride) or an organic material (such as polyimide, polyamide, polyimide amide, benzocyclobutene, and siloxane polymer) as its principal constituent. When the interlayer insulating film is formed of siloxane polymer, it becomes to have a skeleton formed by the bond of silicon and oxygen and include hydrogen or/and alkyl group in a side chain.

An insulator (also referred to as a bank, a partition wall, a barrier, an embankment, etc.) 1214 is formed on each end of the first electrode (anode) 1213. To improve coverage of a film formed on the insulator 1214, an upper edge portion or a lower edge portion of the insulator 1214 is formed so as to have a curved surface having a radius of curvature. The insulator 1214 may be formed of a material containing an inorganic material (such as silicon oxide, silicon nitride, and silicon oxynitride) or an organic material (such as polyimide, polyamide, polyimide amide, benzocyclobutene, and siloxane polymer) as its principal constituent. When the insulator is made from siloxane polymer, it becomes to have a skeleton formed by the bond of silicon and oxygen and include hydrogen or/and alkyl group in a side chain. Further, the insulator 1214 may be covered with a protective film (a planarizing layer) that is made from an aluminum nitride film, an aluminum nitride oxide film, a thin carbon-based film, or a silicon nitride film.

An organic compound material is vapor deposited on the surface of the first electrode (anode) 1213 to form a layer 1215 containing a luminescent substance, selectively.

To remove gases contained in the substrate prior to performing the vapor deposition of the material for the layer containing the luminescent substance, a heat treatment at a temperature of 200 to 300° C. is desirably carried out under a reduced pressure atmosphere or an inert atmosphere.

As for the layer 1215 containing the luminescent substance, the structures as described in Embodiment 7 can be employed, arbitrarily.

In this way, a light emitting element 1217 including the first electrode (anode) 1213, the layer 1215 containing the luminescent substance, and the second electrode (cathode) 1216 can be formed. The light emitting element 1217 emits light toward the second substrate 1204.

A protective lamination layer 1218 is formed to encapsulate the light emitting element 1217. The protective lamination layer is formed by laminating a first inorganic insulating film, a stress relaxation film, and a second inorganic insulating film. The protective lamination layer 1218 and the second substrate 1204 are attached to each other by using the first sealing material 1205 and the second sealing material 1206. The second sealing material is made of an adhesive agent 1219. The surface of the second substrate 1204 is fixed with a polarizing plate 1225 using an adhesive material 1224. The surface of the polarizing plate 1225 is provided with a retardation plate 1229 of ½λ or ¼λ and an antireflection film 1226.

The connection wiring 1208 and the FPC 1209 are electrically connected to one another with an anisotropic conductive film or an anisotropic conductive resin 1227, which is an anisotropic conductive adhesive material.

The light emitting display device using the plastic substrate according to the embodiment is lightweight and can exhibit an excellent impact resistance property.

Embodiment 10

In the present embodiment, an exterior appearance of a light emitting display device panel corresponding to one embodiment of the semiconductor device according to the invention will be explained with reference to FIGS. 13A and 13B. FIG. 13A is a top view of a panel in which a first substrate and a second substrate are attached to each other by using a first sealing material 1205 and a second sealing material 1206 formed on a protective lamination layer 1238. FIG. 13B is a cross sectional view taken along a line A-A' of FIG. 13A. In the embodiment, an example in which a signal line driver circuit using an IC chip is mounted on the light emitting display device is shown.

In FIG. 13A, a reference numeral 1230 represents a signal line driver circuit; 1202, a pixel portion; and 1203, a scanning line driver circuit. Further, a reference numeral 1200 denotes the first substrate; reference numeral 1204 denotes the second substrate; and reference numerals 1205, 1206 denote the first and second sealing materials that contain a gap material for maintaining a gap of an enclosed space, respectively.

The pixel portion 1202 and the scanning line driver circuit 1203 are positioned inside a region sealed with the first and second sealing materials, while the signal line driver circuit 1230 is positioned outside of the region sealed with the first and second sealing materials.

Next, a cross sectional structure will be described referring to FIG. 13B. Driver circuits and a pixel portion are formed over the first substrate 1200, which includes a plurality of semiconductor elements represented by the TFTs. The signal line driver circuit 1230 that is one of the driver circuits is connected to a terminal on an area 1210 with semiconductor elements formed therein. The pixel portion 1202 is provided on the first substrate. The signal line driver circuit 1230 is made from an IC chip using a single crystal silicon substrate. As substitute for the IC chip using the single crystal silicon substrate, an integrated circuit chip formed by a TFT can be used. The pixel portion 1202 and the scanning line driver circuit (not shown in FIG. 13B) are formed of TFTs. The pixel driving TFT and the scanning line driver circuit are formed of inverted-stagger type TFTs, in the embodiment. A part or an entire of respective components for the inverted-stagger type TFTs can be formed by ink-jet, droplet discharging, CVD, PVD, and the like.

A light emitting element 1237 includes a first electrode 1233, a layer 1235 containing a luminescent substance, and a second electrode 1236. The electrodes and layer are formed using the same materials and manufacturing methods of Embodiment 7. The light emitting element is electrically connected to a TFT 1231 via a wiring 1232. Various kinds of signals and potential applied to the scanning line driver circuit 1203 and the pixel portion 1202 are supplied from an FPC 1209 via connection wirings 1208 and 1223. The connection wirings 1208, 1223 and the FPC 1209 are electrically connected to one another with an anisotropic conductive film or anisotropic conductive resin 1227.

A polarizing plate 1225 is provided on the surface of the second substrate 1204 as well as Embodiment 9. A retardation plate 1229 of ½λ or ¼λ and an antireflection film 1226 are provided on the surface of the polarizing plate 1225.

By using the plastic substrate, a lightweight light emitting display device with an improved impact resistance property can be manufactured.

Embodiment 11

Figure 14A:
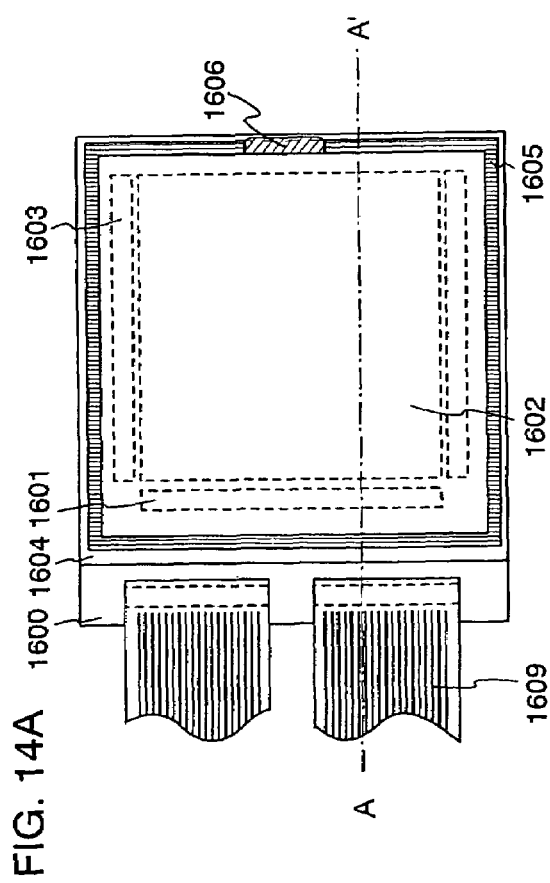
FIG. 14A is a top view and FIG. 14B is a cross sectional view explaining a semiconductor device according to the invention.
Figure 14B:
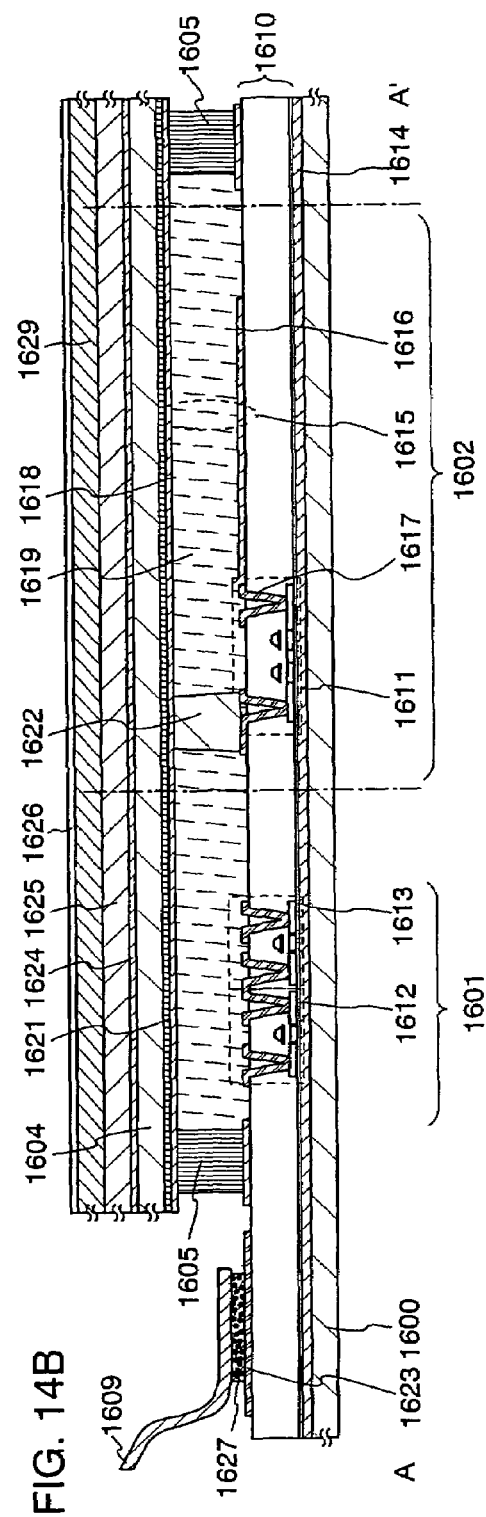

In the present embodiment, an exterior appearance of a liquid crystal display device panel corresponding to one embodiment of the semiconductor device according to the invention will be explained with reference to FIGS. 14A and 14B. FIG. 14A is a tow view of a panel in which a first substrate and a second substrate are attached to each other by using a first sealing material 1605 and a second sealing material 1606. FIG. 14B is a cross sectional view taken along a line A-A' of FIG. 14A.

In FIG. 14A, reference numeral 1601 denoted by a dotted line represents a signal line driver circuit; 1602, a pixel portion; and 1603, a scanning line driver circuit. In the present embodiment, the signal line driver circuit 1601, the pixel portion 1602, and the scanning line driver circuit 1603 are provided inside a region sealed with the first and second sealing materials.

Further, reference numeral 1600 denotes the first substrate; and 1604, the second substrate. Reference numerals 1605 and 1606 represent the first and second sealing materials, respectively, that contain a gap material for maintaining a gap of an enclosed space. The first substrate 1600 and the second substrate 1604 are attached to each other by using the first and second sealing materials 1605, 1606, and a liquid crystal material 1619 is filled therebetween.

A cross sectional structure will be described referring to FIG. 14B. Driver circuits and a pixel portion are formed on the first substrate 1600 having multiple semiconductor elements typified by TFTs. A color filter 1621 is provided on a surface of the second substrate 1604. The signal line driver circuit 1601 and the pixel portion 1602 are illustrated as the driver circuits. The signal line driver circuit 1601 includes a CMOS circuit in combination of an n-channel TFT 1612 and a p-channel TFT 1613.

The TFTs of the signal line driver circuit, the scanning line driver circuit, and the pixel portion are formed on the same substrate in the present embodiment so that volume of the display device can be reduced.

A plurality of pixels is formed in the pixel portion 1602, and a liquid crystal element 1615 is formed in each pixel. The liquid crystal element 1615 indicates a portion overlapping a first electrode 1616, a second electrode 1618, and a liquid crystal material 1619, which is filled between the first and second electrodes, with one another. The first electrode 1616 of the liquid crystal element 1615 is electrically connected to the TFT 1611 via a wiring 1617. The second electrode 1618 of the liquid crystal element 1615 is formed on a side of the second substrate 1604. Note that an alignment film is formed on each surface of respective pixel electrodes, though not shown in the drawing.

Reference numeral 1622 represents a columnar spacer that is provided to maintain a distance (cell gap) between the first electrode 1616 and the second electrode 1618. The spacer is formed by etching an insulating film into a predetermined shape. Alternatively, a spherical spacer may be employed. Various kinds of signals and potential are applied to the signal line driver circuit 1601 and the pixel portion 1602 from an FPC 1609 via a connection wiring 1608. The connection wiring 1608 and the FPC are electrically connected to one another with an anisotropic conductive film or anisotropic conductive resin 1627. Note that a conductive paste such as solder may be used in place of the anisotropic conductive film or anisotropic conductive resin.

A polarizing plate 1625 is fixed on the surface of the second substrate 1604 by using an adhesive material 1624 as well as Embodiment 9. A circular polarizing plate or an elliptical polarizing plate provided with a retardation plate may be used as the polarizing plate 1625. A retardation plate 1629 of ½λ or ¼λ and an antireflection film 1626 are provided on the surface of the polarizing plate 1625. Similarly, the surface of the first substrate 1600 is provided with a polarizing plate (now shown) by an adhesive material.

According to the embodiment, a liquid crystal display device having the plastic substrate can be fabricated. As a consequence, a lightweight, thin liquid crystal display device having an excellent impact resistance property can be manufactured. In addition, a liquid crystal display device having a curved surface and a liquid crystal display device that can be varied in shape can be manufactured.

Embodiment 12

In the present embodiment, an exterior appearance of a panel corresponding to one embodiment of the semiconductor device according to the invention will be explained with reference to FIGS. 15A and 15B. FIG. 15A is a top view of a panel in which a first substrate and a second substrate are attached to each other by using a first sealing material 1605 and a second sealing material 1606. FIG. 15B is a cross sectional view taken along a line A-A' of FIG. 15A. An example in which a signal line driver circuit using an IC chip is mounted on the panel is shown here.

In FIG. 15A, reference numeral 1630 represents a signal line driver circuit; 1602, a pixel portion; and 1603, a scanning line driver circuit. Further, reference numeral 1600 denotes the first substrate; and 1604, the second substrate. Reference numerals 1605 and 1606 represent the first and second sealing materials, respectively, that contain a gap material for maintaining a cell gap of an enclosed space.

The pixel portion 1602 and the scanning line driver circuit 1603 are provided inside a region sealed with the first and second sealing materials, whereas the signal line driver circuit 1630 is provided outside of the region sealed with the first and second sealing materials. The first and second substrates 1600, 1604 are attached to each other by the first and second sealing materials 1605, 1606, and a liquid crystal material is filled therebetween.

Next, a cross sectional structure will be described referring to FIG. 15B. Driver circuits and a pixel portion are formed over the first substrate 1600, which includes a plurality of semiconductor elements represented by TFTs. The signal line driver circuit 1630 that is one of the driver circuits is connected to a terminal on the layer 1610 with the semiconductor elements formed therein. The pixel portion 1602 is provided over the first substrate. The signal line driver circuit 1630 is made from an IC chip suing a single crystal silicon substrate. As substitute for the IC chip using the single crystal silicon substrate, an integrated circuit chip formed of a TFT can be used. The pixel portion 1602 and the scanning line driver circuit (not shown in FIG. 15B) are formed of the TFTs. In the present embodiment, a pixel driving TFT and a scanning line driver circuit are formed of inverted-stagger type TFTs, which are made from an amorphous semiconductor film or a microcrystalline semiconductor film, as well as Embodiment 9.

A first electrode 1616 of the liquid crystal element 1615 is electrically connected to a TFT 1631 via a wiring 1632 in the same manner as Embodiment 11. A second electrode 1618 of the liquid crystal element 1615 is formed on the second substrate 1604. Reference numeral 1622 represents a columnar spacer, and is provided to maintain the distance (cell gap) between the first electrode 1616 and the second electrode 1618. Various kinds of signals and potential are applied to the scanning line driver circuit 1603 and the pixel portion 1602 from an FPC 1609 via connection wirings 1608 and 1623. The connection wirings 1608 and 1623 and the FPC are electrically connected to one another with an anisotropic conductive film or anisotropic conductive resin 1627.

A polarizing plate 1625 is fixed on the surface of the second substrate 1604 with an adhesive material 1624 in the same manner as Embodiment 9. A retardation plate 1629 of ½λ or ¼λ and an antireflection film 1626 are provided on the surface of the polarizing plate 1625.

According to the embodiment, a liquid crystal display device having a plastic substrate can be fabricated. As a consequence, a lightweight, thin liquid crystal display device having an excellent impact resistance property can be manufactured. Additionally, a display device having a curved surface and a display device that can be varied in shape can be manufactured.

Embodiment 13

Figure 17:
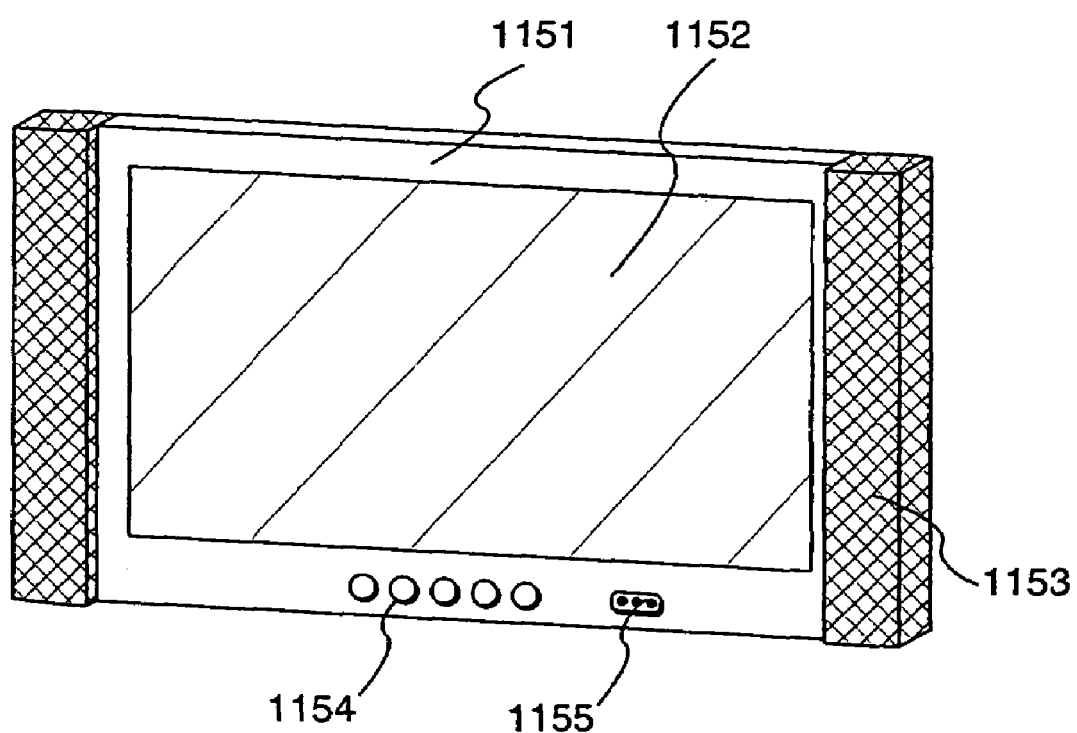
FIG. 17 is a perspective view showing an example of an electronic appliance.
Figure 18A:
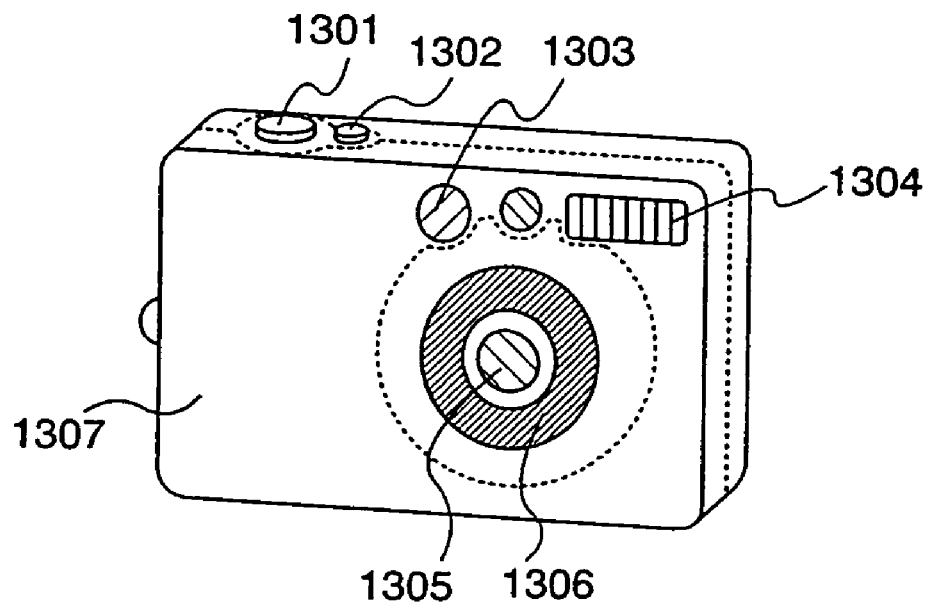
FIGS. 18A and 18B are perspective views showing an example of an electronic appliance.
Figure 18B:
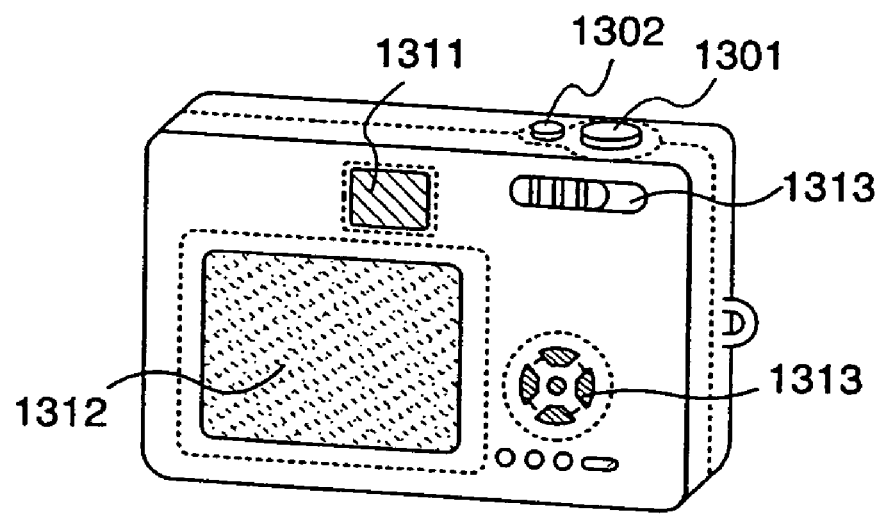

Various kinds of electronic appliances can be manufactured by being incorporated with a semiconductor device formed according to the present invention. Examples of the electronic appliances include: a TV set; a video camera; a digital camera; a goggle type display (a head-mounted display); a navigation system; an audio reproduction device (such as a car audio and an audio component system); a personal laptop computer; a game machine; a portable information terminal (such as a mobile computer, a cellular telephone, a portable game machine, and an electronic book); an image reproduction device provided with a recording medium (concretely, a device which can reproduce the recording medium such as a digital versatile disc (DVD) and display images thereof); and the like. As representative examples of these electronic appliances, a block diagram and a perspective view of a television are shown in FIG. 16 and FIG. 17, respectively, while perspective views of a digital camera are shown in FIGS. 18A and 18B.

Figure 16:
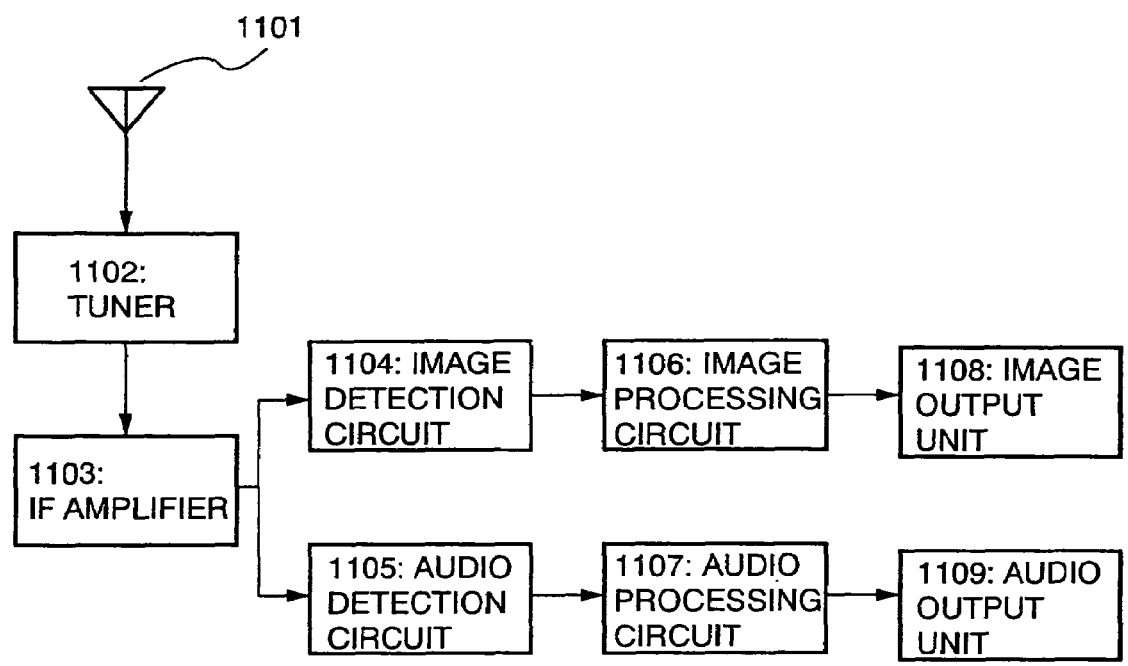
FIG. 16 is a block diagram explaining a structure of an electronic appliance.

FIG. 16 is a block diagram showing a general structure of a television that receives analog television broadcasting. In FIG. 16, the airwaves for television broadcasting received by an antenna 1101 are input in a tuner 1102. The tuner 1102 generates and outputs intermediate frequency (IF) signals by mixing the high frequency television signals input by the antenna 1101 and locally-oscillating frequency signals that are controlled in accordance with the predetermined reception frequency.

The IF signals output from the tuner 1102 are amplified up to the required amount of voltage by an intermediate frequency amplifier (IF amplifier) 1103. Thereafter, the amplified IF signals are detected by an image detection circuit 1104 and an audio detection circuit 1105. The signals output from the image detection circuit 1104 are divided into luminance signals and color signals by an image processing circuit 1106. Further, the luminance signals and the color signals are subjected to the predetermined image signal processing to become image signals so that the image signals are output to an image output unit 1108 such as a DMD (digital micromirror device), a PDP (plasma display panel), an FED (field emission display), and an electrophoretic display device (e.g., an electronic paper).

The signals output from the audio detection circuit 1105 are subjected to processing such as FM demodulation in an audio processing circuit 1107 to become audio signals. The audio signals are then amplified arbitrarily so as to be output to an audio output unit 1109 such as a speaker.

The television according to the present invention may be applicable to digital broadcastings such as digital terrestrial broadcasting, cable digital broadcasting, and BS digital broadcasting, besides analog broadcastings such as regular broadcasting in VHF band, in UHF band, etc., cable broadcasting, and BS broadcasting.

FIG. 17 is a perspective view seen from the front of the television, including a housing 1151; a display portion 1152; speaker units 1153; an operational portion 1154; a video input terminal 1155; and the like. The television shown in FIG. 17 includes the structure as shown in FIG. 16.

The display portion 1152 is an example of the image output unit 1108 in FIG. 16, and displays images.

The speaker units 1153 are examples of the audio output unit in FIG. 16, and output sound therefrom.

The operational portion 1154 is provided with a power source switch, a volume switch, a channel select switch, a tuning switch, a selection switch, and the like so as to turn on and off the television, select images, control sound, select a tuner, and the like, respectively. Note that above-mentioned selections and operations can also be carried out by a remote-control unit, though not illustrated in the drawing.

The video input terminal 1155 inputs image signals into the television from an external portion such as a VTR, a DVD, and a game machine.

In the case of a wall-mounted television, a hanging portion is provided on the rear of the body thereof.

By applying the display device that is an example of a semiconductor device according to the invention to the display portion of the television, a thin, lightweight television having an excellent impact resistance property can be manufactured. When a semiconductor device according to the invention is applied to a CPU for controlling an image detection circuit, an image processing circuit, an audio detection circuit, and an audio processing circuit of a television, a thin, lightweight television with an excellent impact resistance property can be manufactured. Consequently, such a television is widely applicable to wall-mounted televisions, in particular, to large-size display mediums such as information display boards used in railway stations, airports, etc., and advertisement display boards on the streets.

Next, an example in which the display device manufactured according to the invention is applied to a digital camera will be described with reference to FIGS. 18A and 18B.

FIGS. 18A and 18B are diagrams showing an example of the digital camera. FIG. 18A is a perspective view seen from the front of the digital camera, while FIG. 18B is a perspective view seen from the rear thereof. In FIG. 18A, reference numeral 1301 represents a release button; 1302, a main switch; 1303, a viewfinder window; 1304, flash; 1305, a lens; 1306, a lens barrel; and 1307, a housing.

In FIG. 18B, reference numeral 1311 represents a viewfinder eyepiece; 1312, a monitor; and 1313, an operational button.

Upon depressing the release button 1301 halfway, a focus adjustment mechanism and an exposure adjustment mechanism are operated. Subsequently, depressing the release button all the way releases a shutter.

The digital camera is turned on or off by pressing or rotating the main switch 1302.

The viewfinder window 1303 is disposed above the lens 1305 on the front face of the digital camera, and a shooting range and a focusing point are checked through the viewfinder eyepiece 1311 as shown in FIG. 18B and the viewfinder window.

The flash 1304 is disposed at the upper portion of the front face for the digital camera body. In the case of photographing a subject of the low luminance level, when depressing the release button, the shutter is released to take the picture simultaneously with flushing a light.

The lens 1305 is attached to the front of the digital camera. The lens is made of a focusing lens, a zoom lens, and the like. An optical shooting system includes the lens along with a shutter and an aperture, which are not illustrated in the drawing. An image pickup device such as a CCD (charge coupled device) is provided at the rear of the lens.

The lens barrel 1306 is used for shifting the lens position so as to focus the focusing lens, the zoom lens, and the like on a subject. To take the picture, the lens barrel is protruded from the body so that the lens 1305 is shifted toward a subject. When carrying the digital camera, the lens 1305 is stored inside the main body to be reduced in size. Note that although the lens can be zoomed in to enlarge a subject by shifting the lens barrel in the present embodiment, the present embodiment is not limited to the structure. The embodiment can be applicable to a digital camera that can take close-up pictures without zooming a lens due to a structure of an optical shooting system inside the housing 1307.

The viewfinder eyepiece 1311 is provided at the upper portion of the rear of the digital camera, through which the shooting range and the focusing point are checked by sight.

The operational button 1313 represents a button with various kinds of functions and is provided on the rear of the digital camera. The operational button include a setup button, a menu button, a display button, a functional button, a selection button, and the like.

By utilizing the display device that is one embodiment of a semiconductor according to the invention to a monitor of the digital camera, a thinner, portable digital camera can be manufactured. A CPU that is an example of the semiconductor device according to the invention can be applied to a CPU for processing in response to input operation of various functional buttons, a main switch, a release button etc., a CPU for controlling various circuits such as a circuit for autofocusing and autofocusing adjustment, a circuit for controlling electric flash drive, a timing control circuit for CCD drive, an image pickup circuit for generating a image signal from a signal that is converted photoelectrically by an image pickup device such as a CCD, an A/D converter for converting an image signal generated in an image pickup circuit into a digital signal, and a memory interface for writing and reading image data in a memory. The application of the invention permits fabrication of a thinner, portable digital camera.

The present invention has been fully described by way of embodiment modes and embodiments with reference to the accompanying drawings. Note that it should be understood to those skilled in the art that the present invention can be embodied in several forms, and the modes and its details can be changed and modified without departing from the purpose and scope of the present invention. Accordingly, interpretation of the present invention should not be limited to descriptions mentioned in the foregoing embodiment modes and embodiments. Note that portions identical to each other are denoted by same reference numerals in the accompanying drawings for the sake of convenience.

This application is based on Japanese Patent Application serial No. 2003-414879 filed in Japan Patent Office on Dec. 12, 2003, the contents of which are hereby incorporated by reference.

What is claimed is:

1. A method for manufacturing a semiconductor device comprising:
    forming a semiconductor element over a first substrate with a layer interposed therebetween;
    providing a second substrate over the semiconductor element with a photocatalytic layer interposed therebetween;
    peeling the semiconductor element from the first substrate; and
    peeling the second substrate from the semiconductor element by irradiating the photocatalytic layer with a light.

2. A method for manufacturing a semiconductor device according to claim 1, wherein the first or the second substrate is a glass substrate.

3. A method for manufacturing a semiconductor device according to claim 1, wherein the photocatalytic layer is in contact with the second substrate.

4. A method for manufacturing a semiconductor device according to claim 1, wherein the photocatalytic layer contains one selected from the group consisting of titanium oxide, titanate, tantalate, niobate, CdS, and ZnS.

5. A method for manufacturing a semiconductor device according to claim 1, wherein the semiconductor element contains one selected from the group consisting of a thin film transistor, an organic semiconductor transistor, a diode, and an MIM element.

6. A method for manufacturing a semiconductor device according to claim 1, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

7. A method for manufacturing a semiconductor device comprising:
    forming a semiconductor element over a first substrate with a layer interposed therebetween;
    providing a second substrate over the semiconductor element with a photocatalytic layer and an adhesive layer interposed therebetween;
    peeling the semiconductor element from the first substrate; and
    peeling the second substrate from the semiconductor element by irradiating the photocatalytic layer with a light.

8. A method for manufacturing a semiconductor device according to claim 7, wherein the first or the second substrate is a glass substrate.

9. A method for manufacturing a semiconductor device according to claim 7, wherein the photocatalytic layer is in contact with the second substrate.

10. A method for manufacturing a semiconductor device according to claim 7, wherein the photocatalytic layer contains one selected from the group consisting of titanium oxide, titanate, tantalate, niobate, CdS, and ZnS.

11. A method for manufacturing a semiconductor device according to claim 7, wherein the adhesive layer contains one selected from the group consisting of an epoxy resin, a silicon resin, and an acrylic resin.

12. A method for manufacturing a semiconductor device according to claim 7, wherein the semiconductor element contains one selected from the group consisting of a thin film transistor, an organic semiconductor transistor, a diode, and an MIM element.

13. A method for manufacturing a semiconductor device according to claim 7, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

14. A method for manufacturing a semiconductor device comprising:
    forming a semiconductor element over a first substrate with a layer interposed therebetween;
    providing a second substrate over the semiconductor element with a photocatalytic layer interposed therebetween;
    peeling the semiconductor element from the first substrate; and
    peeling the second substrate from the semiconductor element by irradiating the photocatalytic layer with a light from a side of the second substrate.

15. A method for manufacturing a semiconductor device according to claim 14, wherein the first or the second substrate is a glass substrate.

16. A method for manufacturing a semiconductor device according to claim 14, wherein the photocatalytic layer is in contact with the second substrate.

17. A method for manufacturing a semiconductor device according to claim 14, wherein the photocatalytic layer contains one selected from the group consisting of titanium oxide, titanate, tantalate, niobate, CdS, and ZnS.

18. A method for manufacturing a semiconductor device according to claim 14, wherein the semiconductor element contains one selected from the group consisting of a thin film transistor, an organic semiconductor transistor, a diode, and an MIM element.

19. A method for manufacturing a semiconductor device according to claim 14, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

20. A method for manufacturing a semiconductor device comprising:
   forming a semiconductor element over a first substrate with a layer interposed therebetween;
   providing a second substrate over the semiconductor element with a photocatalytic layer and an adhesive layer interposed therebetween;
   peeling the semiconductor element from the first substrate; and
   peeling the second substrate from the semiconductor element by irradiating the photocatalytic layer with a light from a side of the second substrate.

21. A method for manufacturing a semiconductor device according to claim 20, wherein the first or the second substrate is a glass substrate.

22. A method for manufacturing a semiconductor device according to claim 20, wherein the photocatalytic layer is in contact with the second substrate.

23. A method for manufacturing a semiconductor device according to claim 20, wherein the photocatalytic layer contains one selected from the group consisting of titanium oxide, titanate, tantalate, niobate, CdS, and ZnS.

24. A method for manufacturing a semiconductor device according to claim 20, wherein the adhesive layer contains one selected from the group consisting of an epoxy resin, a silicon resin, and an acrylic resin.

25. A method for manufacturing a semiconductor device according to claim 20, wherein the semiconductor element contains one selected from the group consisting of a thin film transistor, an organic semiconductor transistor, a diode, and an MIM element.

26. A method for manufacturing a semiconductor device according to claim 20, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

27. A method for manufacturing a semiconductor device comprising:
   forming a semiconductor element over a first substrate with a layer interposed therebetween;
   providing a second substrate over the semiconductor element with a photocatalytic layer interposed therebetween;
   peeling the semiconductor element from the first substrate; and
   peeling the second substrate from the semiconductor element by irradiating the photocatalytic layer with an ultraviolet light.

28. A method for manufacturing a semiconductor device according to claim 27, wherein the first or the second substrate is a glass substrate.

29. A method for manufacturing a semiconductor device according to claim 27, wherein the photocatalytic layer is in contact with the second substrate.

30. A method for manufacturing a semiconductor device according to claim 27, wherein the photocatalytic layer contains one selected from the group consisting of titanium oxide, titanate, tantalate, niobate, CdS, and ZnS.

31. A method for manufacturing a semiconductor device according to claim 27, wherein the semiconductor element contains one selected from the group consisting of a thin film transistor, an organic semiconductor transistor, a diode, and an MIM element.

32. A method for manufacturing a semiconductor device according to claim 27, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

33. A method for manufacturing a semiconductor device comprising:
   forming a semiconductor element over a first substrate with a layer interposed therebetween;
   providing a second substrate over the semiconductor element with a photocatalytic layer and an adhesive layer interposed therebetween;
   peeling the semiconductor element from the first substrate; and
   peeling the second substrate from the semiconductor element by irradiating the photocatalytic layer with an ultraviolet light.

34. A method for manufacturing a semiconductor device according to claim 33, wherein the first or the second substrate is a glass substrate.

35. A method for manufacturing a semiconductor device according to claim 33, wherein the photocatalytic layer is in contact with the second substrate.

36. A method for manufacturing a semiconductor device according to claim 33, wherein the photocatalytic layer contains one selected from the group consisting of titanium oxide, titanate, tantalate, niobate, CdS, and ZnS.

37. A method for manufacturing a semiconductor device according to claim 33, wherein the adhesive layer contains one selected from the group consisting of an epoxy resin, a silicon resin and, an acrylic resin.

38. A method for manufacturing a semiconductor device according to claim 33, wherein the semiconductor element contains one selected from the group consisting of a thin film transistor, an organic semiconductor transistor, a diode, and an MIM element.

39. A method for manufacturing a semiconductor device according to claim 33, wherein the semiconductor device is one selected from the group consisting of a TV set, a video camera, a digital camera, a goggle type display, a navigation system, an audio reproduction device, a laptop computer, a game machine, a mobile computer, a cellular phone, an electronic book, and an image reproduction device.

40. A method for manufacturing a semiconductor device according to claim 1, wherein the layer includes at least one of a metal film, an oxide film and an anti-reduction film.

41. A method for manufacturing a semiconductor device according to claim 7, wherein the layer includes at least one of a metal film, an oxide film and an anti-reduction film.

42. A method for manufacturing a semiconductor device according to claim 14, wherein the layer includes at least one of a metal film, an oxide film and an anti-reduction film.

43. A method for manufacturing a semiconductor device according to claim 20, wherein the layer includes at least one of a metal film, an oxide film and an anti-reduction film.

44. A method for manufacturing a semiconductor device according to claim 27, wherein the layer includes at least one of a metal film, an oxide film and an anti-reduction film.

45. A method for manufacturing a semiconductor device according to claim 33, wherein the layer includes at least one of a metal film, an oxide film and an anti-reduction film.

* * * * *